(12) United States Patent
Kim et al.

(10) Patent No.: US 12,713,768 B2
(45) Date of Patent: Aug. 18, 2026

(54) DISPLAY DEVICE HAVING ELECTRODE OPENING OVERLAPPING AN AUXILARY CONDUCTIVE LAYER

(71) Applicant: Samsung Display Co., Ltd., Yongin-si (KR)

(72) Inventors: Hyun Kim, Yongin-si (KR); Seul-Ki Kim, Yongin-si (KR); Seung-Ha Choi, Yongin-si (KR); Kap Soo Yoon, Yongin-si (KR); Woogeun Lee, Yongin-si (KR); Yeeun Kang, Yongin-si (KR); Jung Kyoung Cho, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 501 days.

(21) Appl. No.: 18/317,963

(22) Filed: May 16, 2023

(65) Prior Publication Data

US 2024/0016002 A1 Jan. 11, 2024

(30) Foreign Application Priority Data

Jul. 5, 2022 (KR) ........................ 10-2022-0082456

(51) Int. Cl.

*H10K 59/121* (2023.01)
*H10K 59/122* (2023.01)
*H10K 59/80* (2023.01)

(52) U.S. Cl.

CPC ....... *H10K 59/1213* (2023.02); *H10K 59/122* (2023.02); *H10K 59/80515* (2023.02); *H10K 59/80521* (2023.02)

(58) Field of Classification Search

CPC ............. H10K 59/1213; H10K 59/122; H10K 59/80515; H10K 59/80521; H10K 59/80516; H10K 59/80522; H10K 59/124; H10K 59/1315; H10K 59/12; H10K 59/131; H10K 50/805

See application file for complete search history.

(56) References Cited

U.S. PATENT DOCUMENTS

| | | | | |
|---|---|---|---|---|
| 10,177,206 | B2 | 1/2019 | Jung et al. | |
| 10,608,065 | B2 | 3/2020 | Heo | |
| 12,002,821 | B2 | 6/2024 | Kim et al. | |
| 12,289,977 | B2 | 4/2025 | Tang | |
| 2017/0062755 | A1 | 3/2017 | Im et al. | |
| 2019/0067396 | A1* | 2/2019 | Cheng | H10D 86/481 |

(Continued)

FOREIGN PATENT DOCUMENTS

| | | | |
|---|---|---|---|
| CN | 113871430 | A | 12/2021 |
| CN | 114203775 | A | 3/2022 |

(Continued)

*Primary Examiner* — Chad M Dicke
*Assistant Examiner* — Jeremy Daniel Watts
(74) *Attorney, Agent, or Firm* — Innovation Counsel LLP

(57) ABSTRACT

A display device includes a base substrate, a circuit layer including a transistor including a gate electrode, an auxiliary conductive layer, a first insulating layer disposed on the transistor and the auxiliary conductive layer, and a second insulating layer disposed on the first insulating layer, and a display element layer including a pixel defining layer disposed on the circuit layer and a light-emitting element including a first electrode, a functional layer, and a second electrode, which are sequentially stacked.

25 Claims, 22 Drawing Sheets

(56) References Cited

U.S. PATENT DOCUMENTS

| | | | | |
|---|---|---|---|---|
| 2019/0115403 | A1* | 4/2019 | Kang | H10D 30/6723 |
| 2021/0343811 | A1 | 11/2021 | Kim et al. | |
| 2022/0005916 | A1* | 1/2022 | Kim | H10K 59/122 |
| 2022/0102471 | A1* | 3/2022 | Jang | H10K 59/122 |
| 2022/0165980 | A1* | 5/2022 | Shim | H10K 59/124 |
| 2023/0189570 | A1* | 6/2023 | Lin | H10K 59/80521 257/40 |
| 2024/0016033 | A1* | 1/2024 | Lin | H10K 59/80522 |
| 2024/0057447 | A1* | 2/2024 | Lian | H10K 59/80522 |

FOREIGN PATENT DOCUMENTS

| | | | |
|---|---|---|---|
| KR | 10-2017-0124070 | | 11/2017 |
| KR | 10-2018-0036434 | A | 4/2018 |
| KR | 10-2022-0005276 | | 1/2022 |
| KR | 10-2022-0060019 | A | 5/2022 |

* cited by examiner

FIG. 3A

DP
DA
NDA
$PX_{nm}$
$DL_m$
SL1
SLn
PD
$PX_{11}$
DL1
GDC
DR1
DR2
DR3

FIG. 12A 20
10
BFL
OH-S1
E3
E2
E1
EL

PDL
20
10
GI
OH-D
OH-T
OH-AE
OH-S1
10-RS 20-RS
OH-T
OH-D
E1 E2 E3
EL
20-LS 10-LS

FIG. 12D

DP-2
CE
OL
PDL
AE
20
10
GI
OH-T
OH-D
OH-EL
OH-S1
E3
E2
E1
EL
AA-3
OH-T
OH-D

DP-3
CE
OL
PDL
AE
20
10
GI
OH-D
OH-T
OH-EL
OH-S1
IEL
OH-S2
E3
E2
E1
EL
NPXA
AA-4
OH-D
OH-T

DISPLAY DEVICE HAVING ELECTRODE OPENING OVERLAPPING AN AUXILARY CONDUCTIVE LAYER

CROSS-REFERENCE TO RELATED APPLICATION(S)

This application claims priority to and benefits of Korean Patent Application No. 10-2022-0082456 under 35 U.S.C. § 119, filed on Jul. 5, 2022, the entire contents of which are incorporated herein by reference.

BACKGROUND

1. Technical Field

Embodiments relate to a display device including an auxiliary conductive layer electrically connected to a common electrode of a light-emitting element.

2. Description of the Related Art

Multimedia electronic devices such as televisions, mobile phones, tablet computers, navigation systems, and game machines may include a display device for displaying an image. The display device may include pixels, and each of the pixels may include a light-emitting element generating light and a driving element connected to the light-emitting element.

A display device including an organic light-emitting element among light-emitting elements has advantages such as a wide viewing angle, a fast response speed, and low power consumption, thereby attracting attention as a next-generation display device. However, as the area of the display device becomes larger, the stability of a voltage supplied according to a region is deteriorated, and therefore there is a limitation in which luminance non-uniformity occurs.

SUMMARY

Embodiments provide a display device capable of improving reliability by optimizing an electrical connection structure between a common electrode of a light-emitting element and an auxiliary conductive layer.

However, embodiments of the disclosure are not limited to those set forth herein. The above and other embodiments will become more apparent to one of ordinary skill in the art to which the disclosure pertains by referencing the detailed description of the disclosure given below.

In an embodiment, a display device including a display region and a peripheral region disposed on at least one side of the display region, the display region including a light-emitting area and a non-light-emitting area, the display device may include: a base substrate; a circuit layer disposed on the base substrate and including a transistor including a gate electrode, an auxiliary conductive layer, the auxiliary conductive layer and the gate electrode disposed on a same layer, a first insulating layer disposed on the transistor and the auxiliary conductive layer, and a second insulating layer disposed on the first insulating layer; and a display element layer including a pixel defining layer disposed on the circuit layer and a light-emitting element including a first electrode, a functional layer, and a second electrode which are sequentially stacked, wherein an electrode opening overlapping the non-light-emitting area is formed in the circuit layer and the pixel defining layer to expose at least a portion of the auxiliary conductive layer, the pixel defining layer includes a protruding edge portion that opening may not overlap the first insulating layer and may protrude toward inside of the electrode opening, each of the functional layer and the second electrode may be disconnected at an end portion of the protruding edge portion, and the second electrode is electrically connected to the auxiliary conductive layer through the electrode opening.

In an embodiment, the protruding edge portion of the pixel defining layer may protrude more toward inside of the electrode opening than a side edge portion of the first insulating layer, and the electrode opening may include a space under the protruding edge portion of the pixel defining layer.

In an embodiment, a first end portion of the second electrode disposed in the electrode opening may be disposed on an upper surface of the auxiliary conductive layer, and a second end portion of the second electrode may be in contact with an edge portion of the first electrode disposed on a lower surface of the protruding edge portion.

In an embodiment, the first end portion of the second electrode may be disposed directly on the upper surface of the auxiliary conductive layer, and the second end portion of the second electrode may be electrically connected to the auxiliary conductive layer through the edge portion of the first electrode disposed on the lower surface of the protruding edge portion.

In an embodiment, a first side surface of the first insulating layer and a first side surface of the second insulating layer may be exposed through the electrode opening, and a second side surface of the first insulating layer and a second side surface of the second insulating layer may be covered by the first electrode and the pixel defining layer, which are sequentially stacked, wherein the electrode opening may include: a lower opening including a space under the protruding edge portion of the pixel defining layer and disposed between the first side surface of the second insulating layer and the second side surface of the second insulating layer exposed through the space; and an upper opening formed in the pixel defining layer and disposed above the lower opening.

In an embodiment, a first end portion of the functional layer may cover the pixel defining layer covering the second side surface of the second insulating layer in the lower opening, and a second end portion of the functional layer may cover the pixel defining layer defining the upper opening.

In an embodiment, an end edge portion of the second electrode may protrude more toward inside of the lower opening than an end edge portion of the functional layer, and the end edge portion of the second electrode may be disposed directly on the upper surface of the auxiliary conductive layer.

In an embodiment, the first electrode may be disposed on the lower surface of the protruding edge portion, and a lower surface of the first electrode overlapping the protruding edge portion may not overlap the second insulating layer in the lower opening.

In an embodiment, a thickness of the second insulating layer overlapping the non-light-emitting area may be smaller than a thickness of the second insulating layer overlapping the light-emitting area.

In an embodiment, each of the gate electrode and the auxiliary conductive layer may include a first sub-layer including titanium (Ti), a second sub-layer including copper (Cu), and a third sub-layer including indium tin oxide (ITO).

In an embodiment, a first end portion of the second electrode in the electrode opening may be in contact with the second sub-layer, and a second end portion of the second electrode may be in contact with the third sub-layer.

In an embodiment, a second side surface of the first insulating layer may not be covered by the pixel defining layer, and a first side surface of the first insulating layer, a first side surface of the second insulating layer, and a second side surface of the second insulating layer may be covered by the pixel defining layer, wherein the electrode opening may include: a lower opening including a space under the protruding edge portion of the pixel defining layer and disposed between the second sub-layer exposed through the space and the second side surface of the first insulating layer; and an upper opening formed in the pixel defining layer and disposed above the lower opening.

In an embodiment, a first end portion of the functional layer may cover the second side surface of the first insulating layer in the lower opening, and a second end portion of the functional layer may be disposed on the pixel defining layer defining the upper opening.

In an embodiment, an end edge portion of the second electrode may protrude more toward inside of the lower opening than an end edge portion of the functional layer, and the end edge portion of the second electrode may be disposed directly on a side surface of the auxiliary conductive layer.

In an embodiment, the first end portion of the second electrode may be disposed directly on an inclined side surface of the second sub-layer, and the second end portion of the second electrode may be in contact with a side surface of the first sub-layer overlapping the protruding edge portion.

In an embodiment, a first end portion of the second electrode disposed in the electrode opening may be disposed on an upper surface of the auxiliary conductive layer.

In an embodiment, a first side surface of the first insulating layer may be exposed through the electrode opening, and a second side surface of the first insulating layer, a first side surface of the second insulating layer, and a second side surface of the second insulating layer may be covered by the pixel defining layer, wherein the electrode opening may include: a lower opening including a space under the protruding edge portion of the pixel defining layer and disposed between the first side surface of the first insulating layer and the second side surface of the first insulating layer exposed through the space; and an upper opening formed in the pixel defining layer and disposed above the lower opening.

In an embodiment, the functional layer may cover the pixel defining layer exposed through the electrode opening.

In an embodiment, a first end portion of the functional layer is disposed directly on the upper surface of the auxiliary conductive layer in the lower opening, and a first end portion of the second electrode may cover the first end portion of the functional layer in the lower opening, and an end edge portion of the second electrode may protrude more toward inside of the lower opening than an end edge portion of the functional layer.

In an embodiment, the first end portion of the second electrode may be disposed directly on the upper surface of the auxiliary conductive layer, and a second end portion of the second electrode may be insulated from the first electrode and the auxiliary conductive layer by the pixel defining layer.

In an embodiment, the display device may further include an intermediate conductive layer overlapping the non-light-emitting area and disposed between the first insulating layer and the second insulating layer, wherein an end portion of the intermediate conductive layer may be disposed under the protruding edge portion and protrude toward inside of the electrode opening.

In an embodiment, a first end portion of the second electrode disposed in the electrode opening may be disposed on an upper surface of the auxiliary conductive layer, and a second end portion of the second electrode may be in contact with the intermediate conductive layer disposed on the lower surface of the protruding edge portion.

In an embodiment, a first side surface of the first insulating layer may be exposed through the electrode opening, and a second side surface of the first insulating layer, a first side surface of the second insulating layer, and a second side surface of the second insulating layer may be covered by the pixel defining layer, wherein the electrode opening may include: a lower opening including a space under the protruding edge portion and disposed between the first side surface of the first insulating layer and the second side surface of the first insulating layer exposed through the space; and an upper opening formed in the pixel defining layer and disposed above the lower opening.

In an embodiment, the functional layer may cover the pixel defining layer exposed through the electrode opening.

In an embodiment, a first end portion of the functional layer may be disposed directly on the upper surface of the auxiliary conductive layer in the lower opening, and a first end portion of the second electrode may cover a first end portion of the functional layer in the lower opening, wherein an end edge portion of the second electrode may protrude more toward inside of the lower opening than an end edge portion of the functional layer.

In an embodiment, the end edge portion of the second electrode may be disposed directly on the upper surface of the auxiliary conductive layer.

In an embodiment, a first auxiliary opening spaced apart from the electrode opening and passing through the first insulating layer and the second insulating layer may be formed in the non-light-emitting area, a second auxiliary opening passing through the second insulating layer between the electrode opening and the first auxiliary opening may be formed in the non-light-emitting area, wherein an upper surface of the auxiliary conductive layer may be exposed through the first auxiliary opening, and an upper surface of the intermediate conductive layer may be exposed through the second auxiliary opening.

In an embodiment, the first electrode may be in contact with the upper surface of the auxiliary conductive layer through the first auxiliary opening, and the first electrode may be in contact with the upper surface of the intermediate conductive layer through the second auxiliary opening.

In an embodiment, a first end portion of the second electrode may be disposed directly on an upper surface of the auxiliary conductive layer, and a second end portion of the second electrode may be electrically connected to the auxiliary conductive layer through the connected intermediate conductive layer and the first electrode in contact with the intermediate conductive layer.

In an embodiment, the intermediate conductive layer may include indium tin oxide (ITO).

In an embodiment, in the non-light-emitting area, an auxiliary opening may be formed in the circuit layer and may be spaced apart from the electrode opening, wherein the first electrode may be electrically connected to the auxiliary conductive layer in the auxiliary opening.

In an embodiment, an upper portion of the auxiliary opening may be filled with the pixel defining layer.

In an embodiment, a display device may include a base substrate; a display element layer including a pixel defining layer and a light-emitting element including a first electrode, a functional layer, and a second electrode, which are sequentially stacked; and a circuit layer disposed between the base substrate and the display element layer and including a transistor including a gate electrode, an auxiliary conductive layer spaced apart from the gate electrode, the auxiliary conductive layer and the gate electrode disposed on a same layer, a first insulating layer disposed on the gate electrode and the auxiliary conductive layer, and a second insulating layer disposed on the first insulating layer, wherein an electrode opening may be formed in the circuit layer and the pixel defining layer to expose at least a portion of the auxiliary conductive layer EL, each of the functional layer and the second electrode may be disconnected in the electrode opening, and the second electrode is electrically connected to the auxiliary conductive layer through the electrode opening.

In an embodiment, the electrode opening may include a space under a protruding edge portion of the pixel defining layer.

In an embodiment, a first end portion of the second electrode disposed in the electrode opening may be disposed on an upper surface of the auxiliary conductive layer, and a second end portion of the second electrode may be in contact with the first electrode disposed on a lower surface of a protruding edge portion of the pixel defining layer.

In an embodiment, each of the gate electrode and the auxiliary conductive layer may include a first sub-layer including titanium (Ti), a second sub-layer including copper (Cu), and a third sub-layer including indium tin oxide (ITO).

In an embodiment, a first end portion of the second electrode in the electrode opening may be in contact with the second sub-layer, and a second end portion of the second electrode may be in contact with the third sub-layer.

In an embodiment, a first end portion of the second electrode may be disposed directly on an upper surface of the auxiliary conductive layer, and a second end portion of the second electrode may be insulated from the first electrode and the auxiliary conductive layer by the pixel defining layer.

In an embodiment, the display device may further include an intermediate conductive layer overlapping the auxiliary conductive layer and disposed between the first insulating layer and the second insulating layer, wherein an end portion of the intermediate conductive layer may be disposed under a protruding edge portion of the pixel defining layer and protrude toward inside of the electrode opening.

In an embodiment, a first end portion of the second electrode disposed in the electrode opening may be disposed on the upper surface of the auxiliary conductive layer, and a second end portion of the second electrode may be in contact with the intermediate conductive layer disposed on a lower surface of the protruding edge portion.

BRIEF DESCRIPTION OF THE DRAWINGS

The accompanying drawings are included to provide a further understanding of the invention, and are incorporated in and constitute a part of this description. The drawings illustrate embodiments and, together with the description, to explain principles of the invention. In the drawings:

FIG. 3A is a schematic plan view of a display panel according to an embodiment;

FIG. 6 is a schematic cross-sectional view of a portion of the display panel according to an embodiment;

FIGS. 12A, 12B, 12C, and 12D illustrate steps of a method of manufacturing the display device according to an embodiment;

FIGS. 14A, 14B, 14C, and 14D illustrate steps of a method of manufacturing the display device according to an embodiment.

DETAILED DESCRIPTION OF THE EMBODIMENTS

Figure 1:
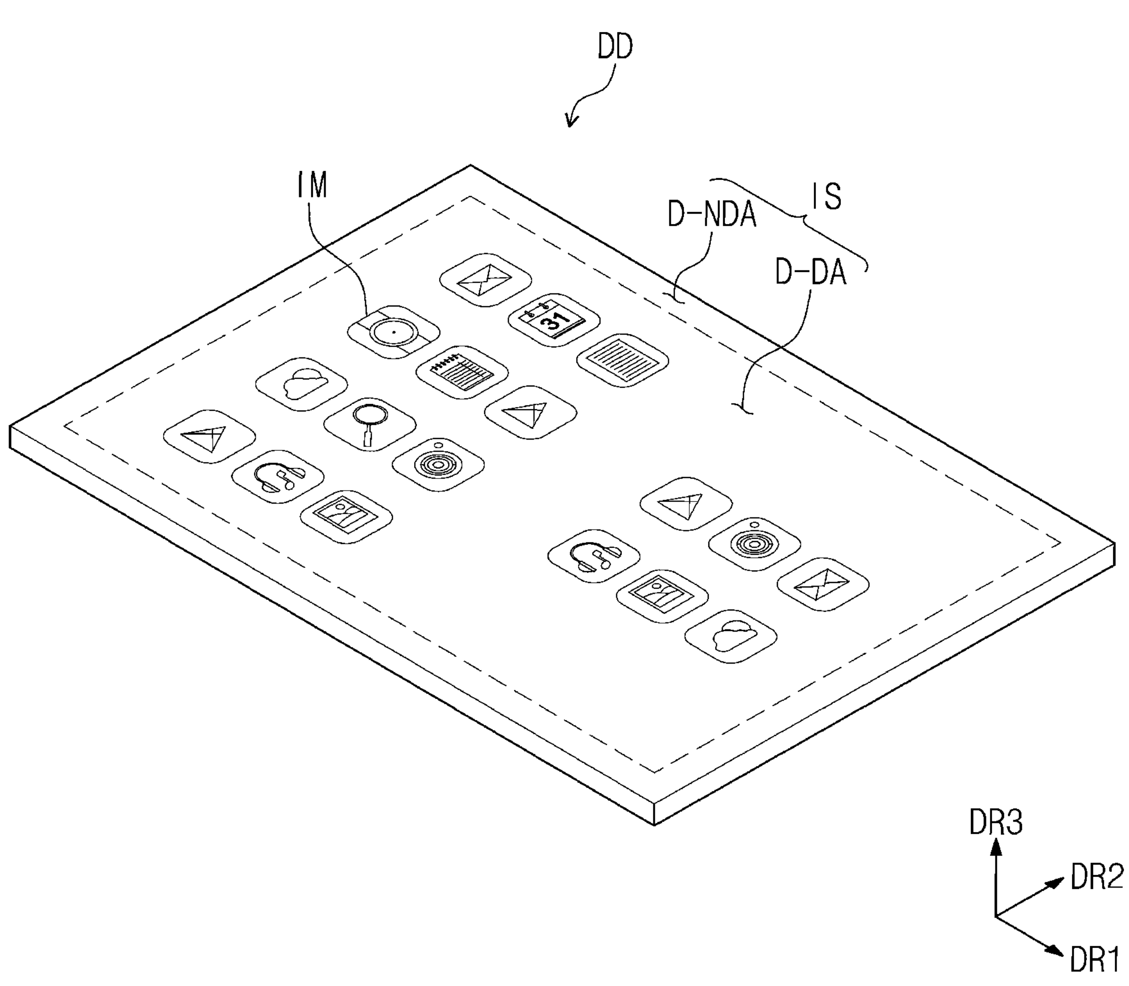
FIG. 1 is a schematic perspective view of a display device according to an embodiment.

In the invention, various modifications are made, various forms are used, and specific embodiments will be illustrated in the drawings and described in detail in the text. However, this is not intended to limit the invention to a specific form disclosed, and it will be understood that all changes, equivalents, and substitutes which fall in the spirit and technical scope of the invention should be included.

In this description, it will be understood that when an element (or region, layer, portion, etc.) is referred to as "being on", "connected to" or "coupled to" another element, it is directly on, connected or coupled to the other element, or intervening elements may be present between them.

In this description, the expression "being directly disposed" may mean that there is no layer, film, region, plate, or the like which is added between a part of a layer, film, region, plate, or the like and another part. For example, the expression "being directly disposed" may mean being disposed between two layers or two members without an additional member such as an adhesive member interposed therebetween.

The same reference numerals or symbols refer to the same elements. In the drawings, the thicknesses, ratios, and dimensions of elements are exaggerated for effective description of technical content. "And/or" includes all combinations of one or more that the associated elements may define.

Terms such as first and second may be used to describe various elements, but the elements should not be limited by the terms. These terms are only used for the purpose of distinguishing one element from other elements. For example, without departing from the scope of the invention, a first element may be referred to as a second element, and similarly, a second element may be referred to as a first element. Singular expressions include plural expressions unless the context clearly indicates otherwise.

In addition, terms such as "below", "lower", "above", and "upper" are used to describe the relationship between elements shown in the drawings. The terms are relative concepts and are described based on the directions indicated in the drawings. In this description, the expression "being disposed on" may refer to being disposed not only on the upper portion of any one member but also on the lower portion thereof.

Terms such as "include" or "have" are intended to designate the presence of a feature, number, step, action, element, portion, or combination thereof described in the description, and it should be understood that it does not preclude the possibility of presence or addition of one or more other features, numbers, steps, operations, elements, portions, or combinations thereof.

Unless otherwise defined, all terms (including technical and scientific terms) used in this description have the same meaning as commonly understood by one of ordinary skill in the art to which this invention belongs. It will be further understood that terms, such as those defined in commonly used dictionaries, should be interpreted as having a meaning that is consistent with their meaning in the context of the related technology, and should not be interpreted in an idealized or overly formal sense unless expressly so defined herein.

Hereinafter, a display device according to an embodiment will be described with reference to the accompanying drawings.

Figure 2A:
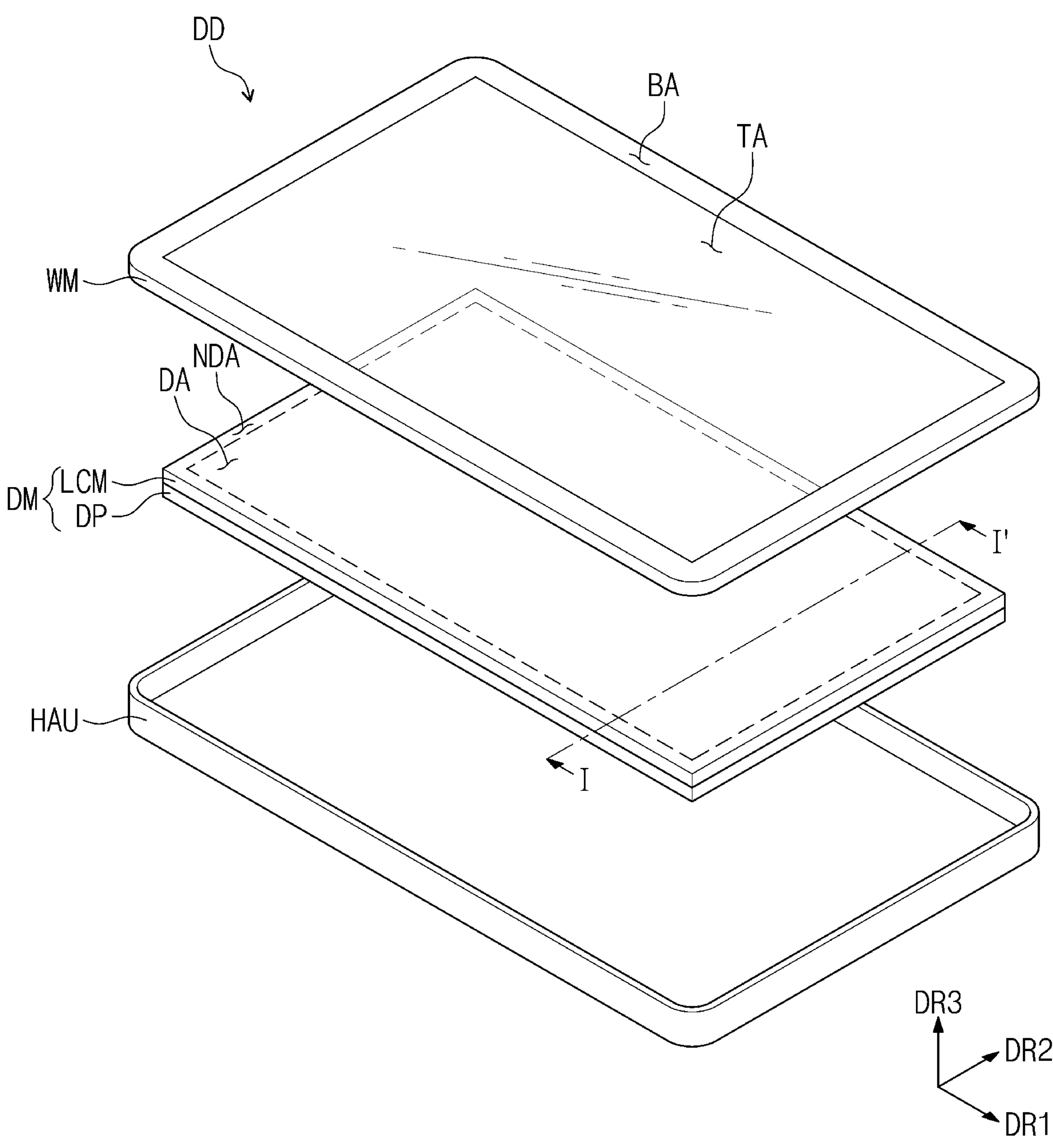
FIG. 2A is a schematic exploded perspective view of the display device according to an embodiment.
Figure 2B:
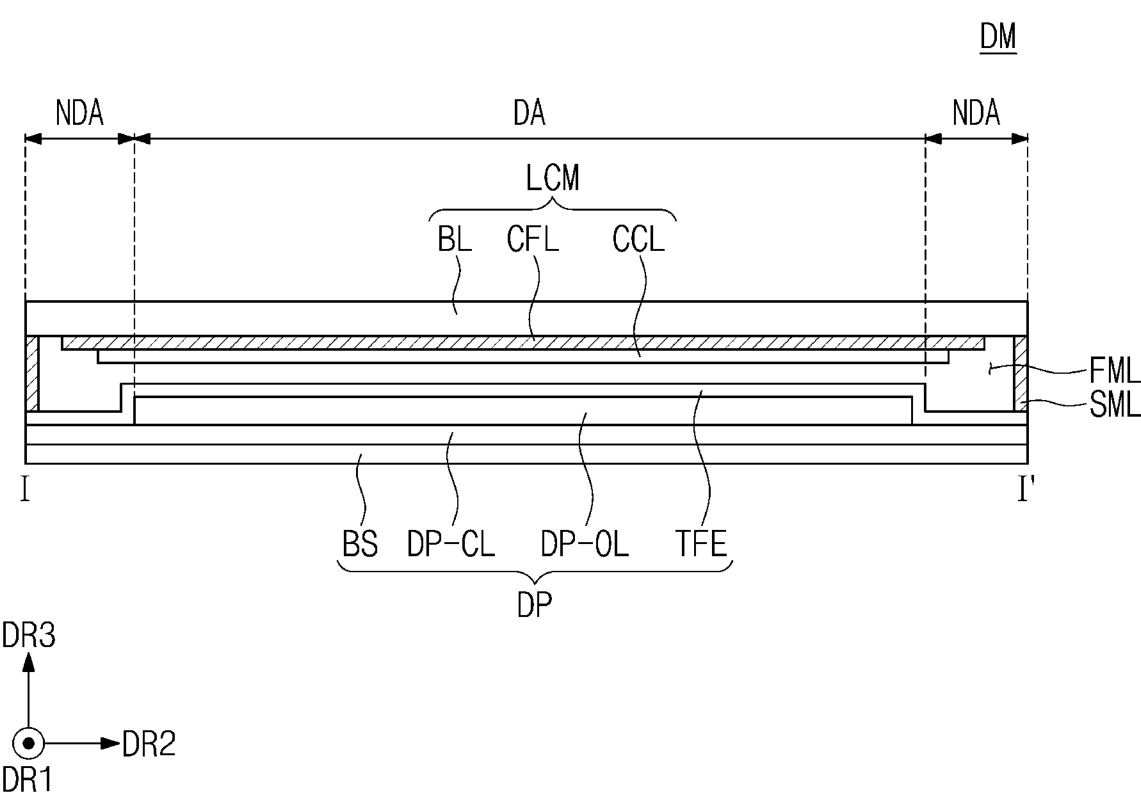
FIG. 2B is a schematic cross-sectional view of a display module according to an embodiment.

FIG. 1 is a schematic perspective view of a display device according to an embodiment. FIG. 2A is a schematic exploded perspective view of the display device according to an embodiment. FIG. 2B is a schematic cross-sectional view of a display module according to an embodiment. FIG. 2B may be a schematic cross-sectional view corresponding to line I-I' of FIG. 2A.

The display device DD may be activated according to an electrical signal and display an image. The display device DD may include various embodiments, and for example, the display device DD may include large devices such as televisions and external billboards, and small and medium-sized devices such as monitors, mobile phones, tablet computers, navigation systems, and game machines. The display device DD are examples, and embodiments are not limited thereto.

In FIG. 1 and the following drawings, a first direction DR1 to a third direction DR3 are illustrated, and directions indicated by the first, second, and third directions DR1, DR2, and DR3 described in this description are relative concepts and may be converted into other directions. The directions indicated by the first, second, and third directions DR1, DR2, and DR3 may be described as first, second, and third directions, and the same reference numerals may be used for the first, second, and third directions.

In this description, the thickness direction of the display device DD may be parallel to the third direction DR3 which is a normal direction with respect to a plane defined by the first direction DR1 and the second direction DR2. In this description, the front surface (or upper surface) and the rear surface (or lower surface) of the members constituting the display device DD may be defined based on the third direction DR3.

The display device DD may display an image IM in a third direction DR3 through a display surface IS parallel to a plane defined by a first direction DR1 and a second direction DR2. The third direction DR3 may be parallel to a normal direction of the display surface IS. The display surface IS on which the image IM is displayed may correspond to the front surface of the display device DD. The image IM may include a still image as well as a dynamic image. FIG. 1 illustrates icon images as an example of the image IM.

In this description, the expression "on a plane" may be defined as a state viewed from the third direction DR3. In this description, the expression "on a cross section" may be defined as a state viewed from the first direction DR1 or the second direction DR2. Directions indicated by the first, second, and third directions DR1, DR2, and DR3 are relative concepts and may be converted into other directions.

FIG. 1 illustrates the display device DD having a flat display surface IS. However, embodiments are not limited thereto. For example, the shape of the display surface IS of the display device DD may be a curved shape or a three-dimensional shape.

The display device DD may be flexible. The term "flexible" refers to a property of being bendable, and a flexible structure may include everything from a completely foldable structure to a structure that may be bent to the level of several nanometers. For example, the flexible display device DD may include a curved display device or a foldable display device. However, embodiments are not limited thereto. For example, the display device DD may be rigid.

The display surface IS of the display device DD may include a display region D-DA and a peripheral region D-NDA. An image IM may be displayed in the display region D-DA. A user may visually recognize the image IM through the display region D-DA. In an embodiment illustrated in FIG. 1, the display region D-DA is illustrated as having a rectangular shape, but this is illustrated as an example, and the display region D-DA may have various shapes.

The peripheral region D-NDA may be a non-display portion that does not display an image IM. The peripheral region D-NDA may be a portion that has a certain color and blocks light. The peripheral region D-NDA may be adjacent to the display region D-DA. For example, the peripheral region D-NDA may be disposed outside at least one side of the display region D-DA, and the peripheral region D-NDA may surround the display region D-DA. However, this is illustrated as an example, and the peripheral region D-NDA may be adjacent only to a side of the display region D-DA or may be disposed on a side surface other than the front surface of the display device DD, and embodiments are not limited thereto. In another example, the peripheral region D-NDA may be omitted.

For example, the display device DD according to an embodiment may sense an external input applied from the outside. The external input may have various forms such as pressure, temperature, and light provided from the outside. The external input may include an input applied at a place close to the display device DD (e.g., hovering) as well as an input that contacts the display device DD (e.g., a touch by a user's hand or a pen).

Referring to FIGS. 2A and 2B, the display device DD may include a window WM, a display module DM, and a housing HAU. For example, the display module DM may include a display panel DP and a light control member LCM. The window WM and the housing HAU may be coupled to each other to form the appearance of the display device DD and may provide an internal space for accommodating the elements of the display device DD such as the display module DM.

The window WM may be disposed on the display module DM. The window WM may protect the display module DM from an external impact. The front surface of the window WM may correspond to the aforementioned display surface IS of the display device DD. The front surface of the window WM may include a transmission region TA and a bezel region BA.

The transmission region TA of the window WM may be an optically transparent region. The window WM may transmit an image provided by the display module DM through the transmission region TA, and a user may visually recognize the corresponding image. The transmission region TA may correspond to (or overlap) the display region D-DA of the display device DD.

The window WM may include an optically transparent insulating material. For example, the window WM may include glass, sapphire, or plastic. The window WM may have a single-layered structure or a multi-layered structure. The window WM may further include functional layers such as an anti-fingerprint layer, a phase control layer, and a hard coating layer which are disposed on an optically transparent substrate.

The bezel region BA of the window WM may be provided as a region on which a material having a certain color is deposited, coated, or printed. The bezel region BA of the window WM may prevent elements of the display module DM, which is disposed to overlap the bezel region BA, from being visually recognized from the outside. The bezel region BA may overlap the peripheral region D-NDA of the display device DD.

The display module DM may display an image according to an electrical signal. The display module DM may include a display region DA and a non-display region NDA adjacent to the display region DA.

The display region DA may be a portion corresponding to (or overlapping) the display region D-DA (see FIG. 1) of the display device DD. The display region DA may be activated according to an electrical signal. The display region DA may be a region that displays an image provided by the display module DM. The display region DA of the display module DM may correspond to the aforementioned transmission region TA. In this description, the expression "a region/portion corresponds to another region/portion" means that "they overlap each other", but the expression is not limited to having a same area and/or a same shape. An image displayed on the display region DA may be visually recognized from the outside through the transmission region TA.

The non-display region NDA may be adjacent to the display region DA. For example, the non-display region NDA may surround the display region DA. However, embodiments are not limited thereto. For example, the non-display region NDA may be formed in various shapes. The non-display region NDA may correspond to (or overlap) the peripheral region D-NDA (see FIG. 1) of the display device DD. The non-display region NDA may be a region in which a driving circuit or driving line that drives the display region DA, various signal lines that provide electrical signals, and pads are disposed. The non-display region NDA of the display module DM may correspond to (or overlap) the aforementioned bezel region BA. The elements of the display module DM disposed in the non-display region NDA may be prevented from being visually recognized by the bezel region BA.

The display panel DP according to an embodiment may be a light-emitting display panel and embodiments are not limited thereto. For example, the display panel DP may be an organic light-emitting display panel, an inorganic light-emitting display panel, or a quantum dot light-emitting display panel. The light-emitting layer of the organic light-emitting display panel may include an organic light-emitting material, and the light-emitting layer of the inorganic light-emitting display panel may include an inorganic light-emitting material. The light-emitting layer of the quantum dot light-emitting display panel may include quantum dots, quantum rods, and the like. Hereinafter, the display panel DP will be described as an organic light-emitting display panel.

The display panel DP may include a base substrate BS, a circuit layer DP-CL, a display element layer DP-OL, and an encapsulation layer TFE. Hereafter, each layer of the display panel DP will be described.

The light control member LCM may be disposed on the display panel DP. After the light control member LCM is formed on the display panel DP, the light control member LCM may be coupled to the display panel DP through a bonding process using a sealing member SML.

However, embodiments are not limited thereto. For example, the light control member LCM may be disposed (e.g., directly disposed) on the display panel DP. In this description, being formed by a continuous process without a separate adhesive layer or adhesive member may be expressed as "being directly disposed". For example, the expression "the light control member LCM is disposed directly on the display panel DP" may mean that the configuration of the light control member LCM is formed by a continuous process on a base surface provided by the display panel DP after the display panel DP is formed.

The sealing member SML may be disposed in the non-display region NDA, which is an outer portion of the display module DM, to prevent foreign substances, oxygen, moisture, and the like from entering or permeating into the display module DM from the outside. The sealing member SML may be formed of a sealant including a curable resin.

For example, the display module DM according to an embodiment may further include a filling layer FML disposed between the display panel DP and the light control member LCM. The filling layer FML may fill a space between the display panel DP and the light control member LCM. The filling layer FML may function as a buffer between the display panel DP and the light control member LCM. In an embodiment, the filling layer FML may perform a shock absorbing function and the like, and may increase the strength of the display module DM. The filling layer FML may be formed of a filling resin including a polymer resin. For example, the filling layer FML may be formed of a filling resin including an acrylic-based resin, an epoxy-based resin, or the like. In another example, the filling layer FML and the sealing member SML may be omitted, the light control member LCM may be disposed (e.g., directly disposed) on the display panel DP, and a base layer BL may be omitted in the light control member LCM.

The light control member LCM may include light control pattern layers capable of converting the optical properties of a source light provided from the display panel DP. The light control member LCM may selectively convert the wavelength or color of the source light or transmit the source light. The light control member LCM may control the color purity or color reproducibility of light emitted from the display device DD and prevent reflection of external light incident from the outside of the display device DD. For example, in an embodiment, the light control member LCM may include quantum dots that convert the wavelength of the source light provided from the display panel DP. In an embodiment, the light control member LCM may include a light control layer CCL including quantum dots and a color filter CFL disposed on the light control layer CCL.

The housing HAU may be disposed below and accommodate the display module DM. As the housing HAU absorbs a shock applied from the outside and prevents foreign substances/moisture from entering or permeating into the display module DM, the housing HAU may protect the display module DM. The housing HAU according to an embodiment may be provided in a form in which accommodation members are coupled to each other.

For example, the display module DM may further include an input detection unit. The input detection unit may sense or measure the coordinate information of an external input applied from the outside of the display device DD. The input detection unit may be disposed between the display panel DP and the light control member LCM. For example, the input detection unit may be disposed (e.g., directly disposed) on the display panel DP through a continuous process. However, embodiments are not limited thereto. For example, the input detection unit may be separately manufactured and attached to the display panel DP by an adhesive layer.

Figure 3A:
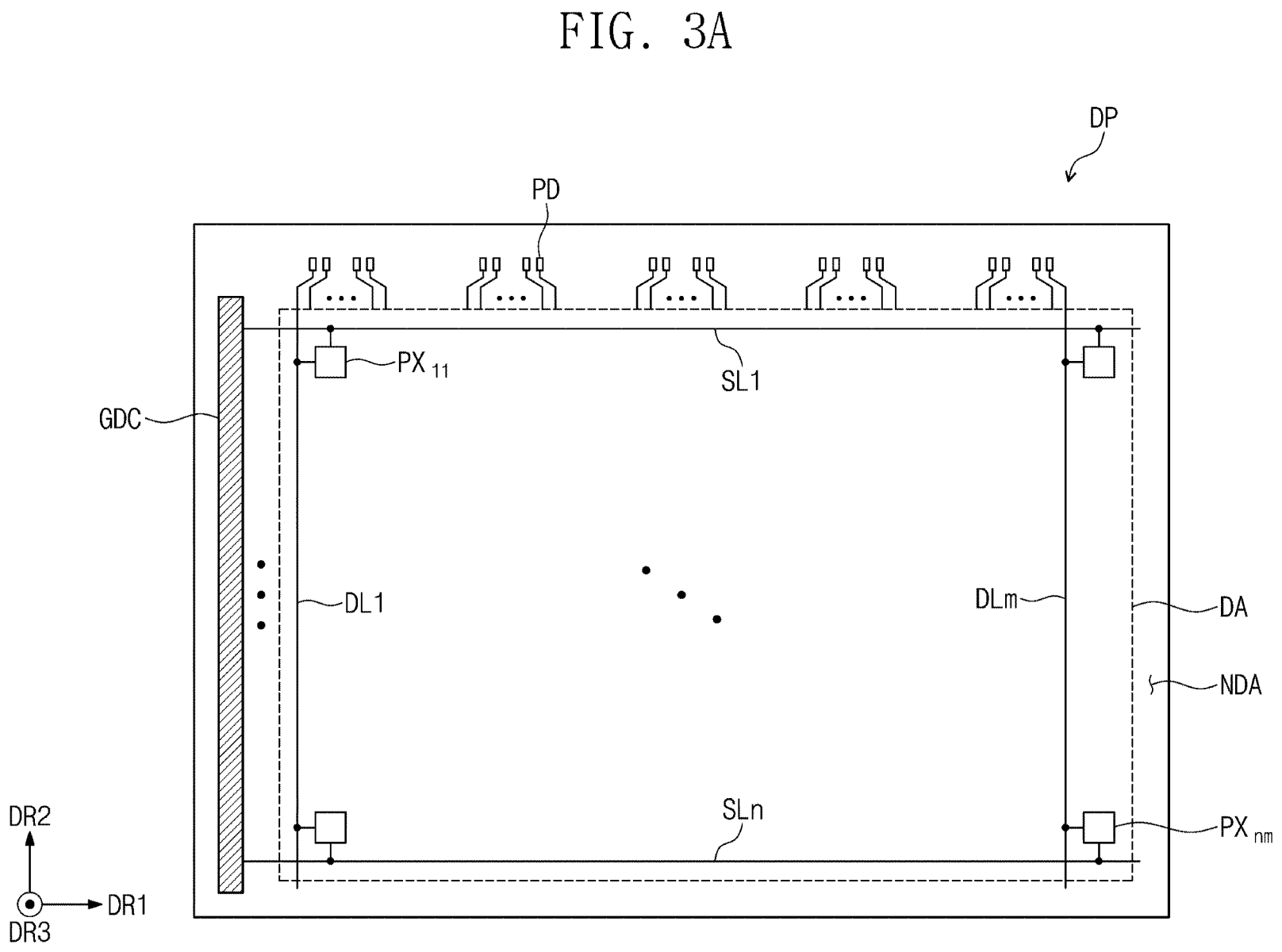
Figure 3B:
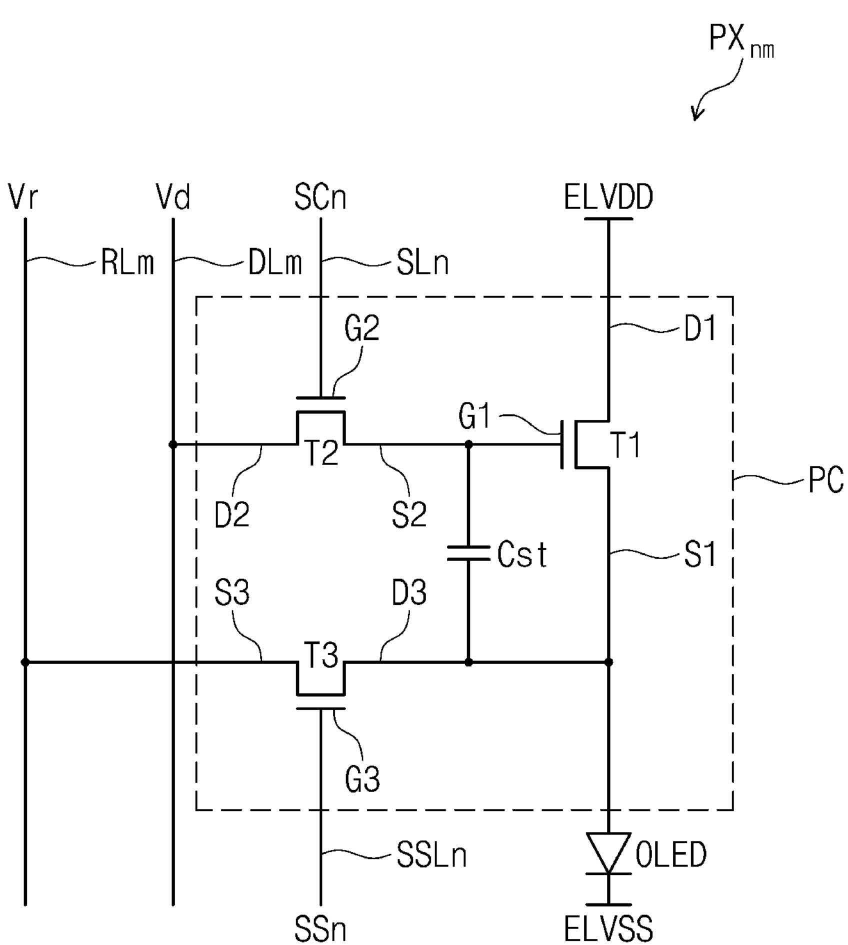
FIG. 3B is a schematic diagram of an equivalent circuit of a pixel according to an embodiment.

FIG. 3A is a schematic plan view of a display panel according to an embodiment. FIG. 3B is a schematic diagram of an equivalent circuit of a pixel according to an embodiment.

Referring to FIG. 3A, the display panel DP may include pixels $PX_{11}$ to $PX_{nm}$ and signal lines SL1 to SLn and DL1 to DLm electrically connected to the pixels $PX_{11}$ to $PX_{nm}$, which are disposed in the display region DA. The display panel DP may include a driving circuit GDC and pads PD, which are disposed in the non-display region NDA.

Each of the pixels $PX_{11}$ to $PX_{nm}$ may include a light-emitting element to be described below and a pixel driving circuit composed of transistors (e.g., a switching transistor, a driving transistor, and the like) connected to the light-emitting element and a capacitor. Each of the pixels $PX_{11}$ to $PX_{nm}$ may emit light in response to an electrical signal applied to the pixel. Although FIG. 3A illustrates the pixels $PX_{11}$ to $PX_{nm}$ arranged in a matrix form, the arrangement form of the pixels $PX_{11}$ to $PX_{nm}$ is not limited thereto.

The signal lines SL1 to SLn and DL1 to DLm may include scan lines SL1 to SLn and data lines DL1 to DLm. Each of the pixels $PX_{11}$ to $PX_{nm}$ may be connected to a corresponding scan line among the scan lines SL1 to SLn and a corresponding data line among the data lines DL1 to DLm. According to the configuration of the pixel driving circuit of the pixels $PX_{11}$ to $PX_{nm}$, more types of signal lines may be formed in the display panel DP.

The driving circuit GDC may include a gate driving circuit. The gate driving circuit may generate gate signals and sequentially output the gate signals to the scan lines SL1 to SLn. The gate driving circuit may further output another control signal to the pixel driving circuit of the pixels $PX_{11}$ to $PX_{nm}$.

The driving circuit GDC and the pixels $PX_{11}$ to $PX_{nm}$ according to an embodiment may include thin-film transistors formed by a low temperature polycrystalline silicon (LTPS) process, a low temperature polycrystalline oxide (LTPO) process, or an oxide semiconductor process.

The pads PD may be arranged along a direction on the non-display region NDA. The pads PD may be parts connected to the circuit board. Each of the pads PD may be connected to a corresponding signal line among the signal lines SL1 to SLn and DL1 to DLm and electrically connected to a corresponding pixel through the signal line. The pads PD may have an integral shape with the signal lines SL1 to SLn and DL1 to DLm. However, embodiments are not limited thereto. For example, the pads PD may be disposed on a layer different from that of the signal lines SL1 to SLn and DL1 to DLm and connected thereto through a contact hole.

FIG. 3B illustrates a pixel $PX_{nm}$ connected to an n-th scan line SLn, an n-th sensing line SSLn, an m-th data line DLm, and an m-th reference line RLm. Referring to FIG. 3B, the pixel $PX_{nm}$ may include a pixel circuit PC and a light-emitting element OLED connected to the pixel circuit PC.

The pixel circuit PC may include transistors T1, T2, and T3 and a capacitor Cst. The transistors T1, T2, and T3 may include a first transistor T1 (e.g., a driving transistor), a second transistor T2 (e.g., a switch transistor), and a third transistor T3 (e.g., a sensing transistor). Each of the first, second, and third transistors T1, T2, and T3 may be a thin-film transistor.

The first, second, and third transistors T1, T2, and T3 may be NMOS transistors, but embodiments are not limited thereto. For example, the first, second, and third transistors T1, T2, and T3 may be PMOS transistors. Each of the first, second, and third transistors T1, T2, and T3 may include a source S1, S2, or S3, a drain D1, D2, or D3, and a gate electrode G1, G2, or G3.

Figure 5:
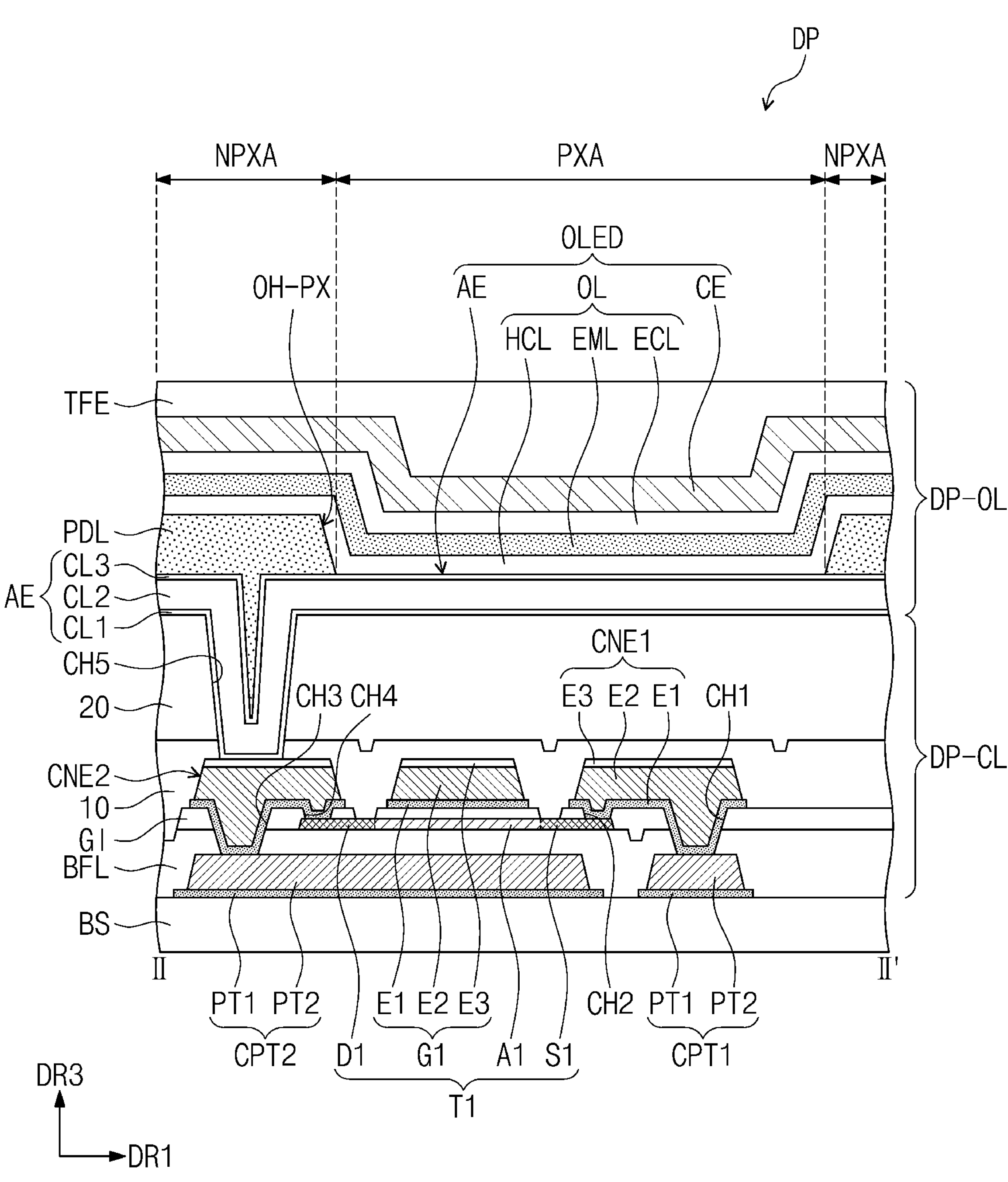
FIG. 5 is a schematic cross-sectional view of a portion of the display panel according to an embodiment.

The light-emitting element OLED may be an organic light-emitting element including a first electrode AE (see FIG. 5) and a second electrode CE (see FIG. 5). For example, the first electrode AE may be referred to as an anode or a pixel electrode, and the second electrode may be referred to as a cathode or a common electrode. The first electrode AE of the light-emitting element OLED (see FIG. 5) may receive a first voltage ELVDD through the driving transistor T1, and the second electrode CE (see FIG. 5) of the light-emitting element OLED may receive a second voltage ELVSS. The light-emitting element OLED may receive the first voltage ELVDD and the second voltage ELVSS to emit light.

The driving transistor T1 may include a drain D1 that receives the first voltage ELVDD, a source S1 connected to the first electrode AE (see FIG. 5) of the light-emitting element OLED, and a gate electrode G1 connected to the capacitor Cst. The driving transistor T1 may control a driving current which flows through the light-emitting element OLED from the first voltage ELVDD in response to a voltage value stored in the capacitor Cst.

The switch transistor T2 may include a drain D2 connected to an m-th data line DLm, a source S2 connected to the capacitor Cst, and a gate electrode G2 that receives an n-th writing scan signal SCn. The m-th data line DLm may receive a data voltage Vd and a sensing data voltage. The switch transistor T2 may transfer the data voltage Vd input from the m-th data line DLm to the driving transistor T1 according to a switching voltage input from the n-th writing scan signal SCn.

The sensing transistor T3 may include a source S3 connected to an m-th reference line RLm, a drain D3 connected to the first electrode AE (see FIG. 5) of the light-emitting element OLED, and a gate electrode G3 that receives an n-th sampling scan signal SSn. The m-th reference line RLm may receive a reference voltage Vr.

The capacitor Cst may be connected to the gate electrode G1 of the driving transistor T1 and the first electrode AE (see FIG. 5) of the light-emitting element OLED. The capacitor Cst may include a first capacitor electrode connected to the gate electrode G1 of the driving transistor T1 and a second capacitor electrode connected to the first electrode AE (see FIG. 5) of the light-emitting element OLED. The capacitor Cst may store a voltage corresponding to a difference between a voltage transmitted from the switch transistor T2 and the first voltage ELVDD.

For example, the equivalent circuit of the pixel $PX_{nm}$ illustrated in FIG. 3B is illustrated for a single pixel $PX_{nm}$, and the equivalent circuit of the pixels $PX_{11}$ to $PX_{nm}$ is not limited to what is illustrated in FIG. 3B. In another embodiment, the equivalent circuit diagram of the pixel $PX_{nm}$ may be implemented in various forms in order for the light-emitting element OLED to emit light.

Figure 4:
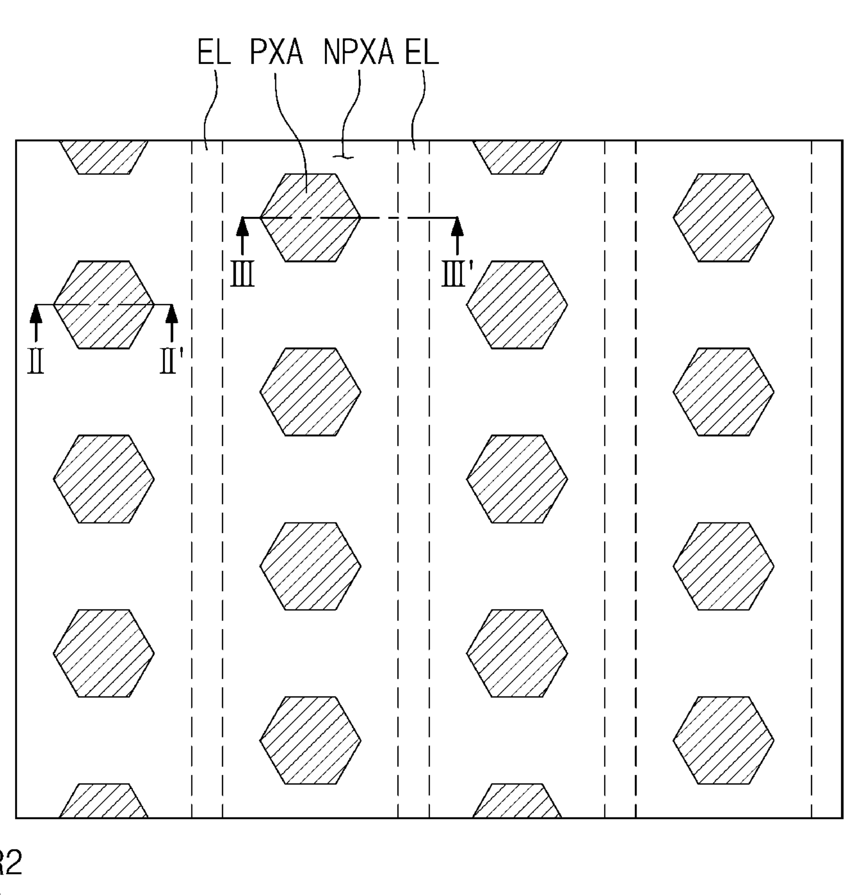
FIG. 4 is a schematic plan view of a portion of the display panel according to an embodiment.
Figure 4:
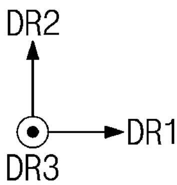

FIG. 4 is a schematic enlarged plan view illustrating a portion of the display panel according to an embodiment. Referring to FIG. 4, the display panel DP according to an embodiment may include light-emitting areas PXA and a non-light-emitting area NPXA surrounding each of the light-emitting areas PXA. FIG. 4 illustrates an auxiliary conductive layer EL disposed in the non-light-emitting area NPXA. The auxiliary conductive layer EL may be disposed on the base substrate BS (see FIG. 2) and may be a portion to which the second voltage ELVSS (see FIG. 3B) is applied.

Although FIG. 4 illustrates that the auxiliary conductive layer EL has a line shape extending in a direction parallel to the second direction DR2, embodiments are not limited thereto. In an embodiment, the auxiliary conductive layer EL may have a line shape extending in a direction parallel to the first direction DR1 or a grid shape surrounding each light-emitting area PXA. As long as the auxiliary conductive layer EL provides the second voltage to each of the pixels $PX_{nm}$ (see FIG. 3A), the auxiliary conductive layer EL is not limited to any one embodiment and may have various shapes. Hereafter, the auxiliary conductive layer EL will be described.

The light-emitting area PXA may be a portion to which light emitted from the light-emitting element OLED (see FIG. 5) is provided. For example, each of the light-emitting areas PXA may correspond to each of the pixels $PX_{11}$ to $PX_{nm}$ (see FIG. 3A) disposed in the display region DA (see FIG. 3A). Referring to FIGS. 3A and 4, the display panel DP according to an embodiment may include a display region DA and a non-display region NDA. For example, the display region DA may include light-emitting areas PXA and a non-light-emitting area NPXA.

Each of the light-emitting areas PXA may have a polygonal shape on a plane defined by the first direction DR1 and the second direction DR2. Although FIG. 4 illustrates a case in which each of the light-emitting areas PXA has a hexagonal shape on a plane, embodiments are not limited thereto. The shape of the light-emitting areas PXA on a plane may be a polygonal or circular shape and may be variously modified according to the light output characteristics required for the display device.

In an embodiment, the light-emitting area PXA may be a portion that provides a source light to the light control member LCM (see FIG. 2A). The source light provided from the light-emitting area PXA may be blue light. In an embodiment, the light-emitting areas PXA may provide light in the same wavelength region. However, embodiments are not limited thereto. In an embodiment, the display panel DP may include light-emitting areas that emit light in different wavelength regions. For example, the light-emitting areas PXA may include light-emitting areas that respectively provide blue light, green light, and red light, and the light-emitting areas that provide light in different wavelength regions may be arranged in various combinations according to the display quality characteristics required for the display device.

Figure 6:
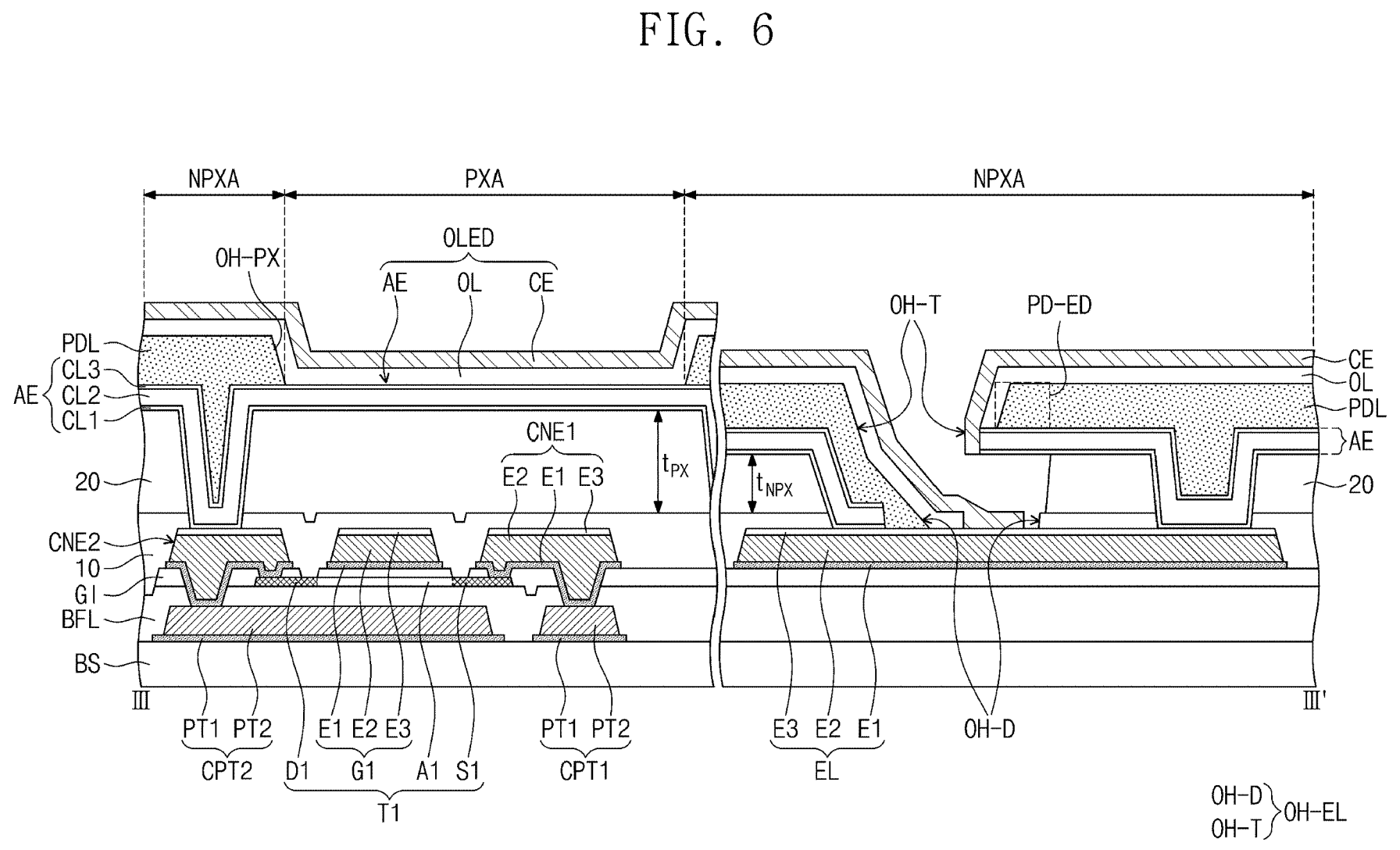

Each of FIGS. 5 and 6 is a schematic cross-sectional view of a portion of the display panel according to an embodiment. FIG. 5 is a schematic cross-sectional view of a portion corresponding to line II-IT of FIG. 4 and illustrates one of the light-emitting areas PXA and a portion adjacent thereto and overlapping the non-light-emitting area NPXA. FIG. 6 is a schematic cross-sectional view of a portion corresponding to line III-III' of FIG. 4 and illustrates one light-emitting area PXA and a portion overlapping the non-light-emitting area NPXA which is adjacent thereto and in which the auxiliary conductive layer EL is disposed.

The display panel DP according to an embodiment may include a base substrate BS, a circuit layer DP-CL, a display element layer DP-OL, and an encapsulation layer TFE that are sequentially stacked. In FIG. 6, the encapsulation layer TFE is omitted when compared to FIG. 5, and the display panel according to an embodiment is illustrated to include the non-light-emitting area NPXA in which the auxiliary conductive layer EL is disposed.

The display panel DP may include insulating layers, a semiconductor pattern layer, a conductive pattern layer, a signal line, and the like. In a manufacturing step of the display panel DP, an insulating layer, a semiconductor layer, and a conductive layer may be formed on the base substrate BS by coating, deposition, or the like. Hereafter, the insulating layer, the semiconductor layer, and the conductive layer may be selectively patterned by a photolithography process. Through this process, the semiconductor pattern layer, the conductive pattern layer, the signal line, and the like included in the circuit layer DP-CL may be formed. The semiconductor pattern layer of the circuit layer DP-CL may be arranged in a certain rule over the pixels.

The base substrate BS may include a glass substrate, a metal substrate, a polymer substrate, or an organic/inorganic composite material substrate. The base substrate BS may have a single-layered structure or a multi-layered structure. For example, the base substrate BS having a multi-layered structure may include synthetic resin layers and at least one inorganic layer disposed between the synthetic resin layers.

The synthetic resin layer of the base substrate BS may include at least one of an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, a perylene-based resin, or a polyimide-based resin. However, the material of the synthetic resin layer of the base substrate BS is not limited to the above examples.

The circuit layer DP-CL may be disposed on the base substrate BS. In the display panel DP according to an embodiment, the circuit layer DP-CL may include conductive pattern layers CPT1 and CPT2, a transistor T1, connection electrodes CNE1 and CNE2, a buffer layer BFL, and insulating layers GI, 10, and 20.

Although FIG. 5 illustrates a single transistor T1 electrically connected to the light-emitting element OLED, a single pixel $PX_{nm}$ may include transistors that drive the light-emitting element OLED as illustrated in FIG. 3B.

In an embodiment, the circuit layer DP-CL may include a first conductive pattern layer CPT1 and a second conductive pattern layer CPT2 which are disposed on the base substrate BS. The first conductive pattern layer CPT1 and the second conductive pattern layer CPT2 may be spaced apart from each other. The first conductive pattern layer CPT1 and the second conductive pattern layer CPT2 may be disposed under the transistor T1. The first conductive pattern layer CPT1 and the second conductive pattern layer CPT2 may have a stacked structure. Each of the first conductive pattern layer CPT1 and the second conductive pattern layer CPT2 may include a first pattern portion PT1 and a second pattern portion PT2 which are stacked in a thickness direction. In an embodiment, the thickness of the second pattern portion PT2 and the thickness of the first pattern portion PT1 may be different from each other. For example, in an embodiment, the thickness of the second pattern portion PT2 may be greater than the thickness of the first pattern portion PT1. However, embodiments are not limited thereto.

Each of the first pattern portion PT1 and the second pattern portion PT2 may be formed of any one of molybdenum (Mo), aluminum (Al), chromium (Cr), gold (Au), titanium (Ti), nickel (Ni), neodymium (Nd), and copper (Cu), or an alloy thereof. For example, the first pattern portion PT1 may include titanium (Ti), and the second pattern portion PT2 may include copper (Cu). However, embodiments are not limited thereto.

The buffer layer BFL may be disposed on the first and second conductive pattern layers CPT1 and CPT2. The buffer layer BFL may be disposed on the base substrate BS so as to cover the first and second conductive pattern layers CPT1 and CPT2.

The buffer layer BFL may improve coupling force between the base substrate BS and the semiconductor pattern layer of the circuit layer DP-CL. The buffer layer BFL may include at least one of aluminum oxide, titanium oxide, silicon oxide, silicon nitride, silicon oxynitride, zirconium oxide, or hafnium oxide, but embodiments are not limited to the above materials.

The semiconductor pattern layer of the circuit layer DP-CL may be disposed on the buffer layer BFL. The semiconductor pattern layer may include polysilicon. However, embodiments are not limited thereto. For example, the semiconductor pattern layer may include amorphous silicon or metal oxide.

The source S1, the active Al, and the drain D1 of the transistor T1 may be formed of a semiconductor pattern layer. The semiconductor pattern layer of the transistor T1 may be divided into regions according to the degree of conductivity. For example, the electrical properties of the semiconductor pattern layer may vary depending on whether or not the semiconductor pattern layer is doped, or whether or not the metal oxide is reduced. A region having relatively high conductivity in the semiconductor pattern layer may function as an electrode or a signal line and correspond to the source S1 or the drain D1 of the transistor Ti. A non-doped region, a region doped with a relatively low concentration, or a non-reduced region of the semiconductor pattern layer may have relatively low conductivity, and a corresponding region may correspond to the active Al of the transistor T1.

The circuit layer DP-CL may include insulating layers and transistors constituting the pixel circuit PC (see FIG. 3B). FIG. 5 illustrates a first transistor T1, an interlayer insulating layer GI, a first insulating layer 10, and a second insulating layer 20. The interlayer insulating layer GI, the first insulating layer 10, and the second insulating layer 20 may be sequentially disposed above the buffer layer BFL. The insulating layers GI, 10, and 20 may include an inorganic layer or an organic layer and have a single-layered structure or a multi-layered structure.

The inorganic layer may include at least one of aluminum oxide, titanium oxide, silicon oxide, silicon nitride, silicon oxynitride, zirconium oxide, or hafnium oxide, but embodiments are not limited to the above materials. The organic layer may include a phenol-based polymer, an acrylic-based polymer, an imide-based polymer, an aryl ether-based polymer, an amide-based polymer, a fluorine-based polymer, a p-xylene-based polymer, a vinyl alcohol-based polymer, and a combination thereof, but embodiments are not limited to the above materials.

The interlayer insulating layer GI may cover the semiconductor pattern layer of the circuit layer DP-CL. The gate electrode G1 of the first transistor T1 may be disposed on the interlayer insulating layer GI. The gate electrode G1 may be a portion of the conductive pattern layer. The gate electrode G1 may overlap the active Al. The gate electrode G1 may function as a mask in the process of doping the semiconductor pattern layer. The interlayer insulating layer GI may be an inorganic layer.

The first insulating layer 10 may be disposed on the interlayer insulating layer GI and cover the gate electrode G1. The second insulating layer 20 may be disposed on the first insulating layer 10.

For example, a layer including a transistor (e.g., the first transistor T1 of FIG. 5) formed among the buffer layer BFL, the interlayer insulating layer GI, the first insulating layer 10, and the second insulating layer 20 may be formed as a transistor layer.

The gate electrode G1 and the connection electrodes CNE1 and CNE2 may be disposed on the interlayer insulating layer GI. The gate electrode G1, the first connection electrode CNE1, and the second connection electrode CNE2 may be spaced apart from each other on the interlayer insulating layer GI. The gate electrode G1, the first connection electrode CNE1, and the second connection electrode CNE2 may be formed by being simultaneously patterned with a same material. Each of the gate electrode G1, the first connection electrode CNE1, and the second connection electrode CNE2 may have a structure in which layers are stacked. For example, each of the gate electrode G1, the first connection electrode CNE1, and the second connection electrode CNE2 may include a first sub-layer E1, a second sub-layer E2, and a third sub-layer E3 which are sequentially stacked. However, embodiments are not limited thereto. For example, each of the gate electrode G1, the first connection electrode CNE1, and the second connection electrode CNE2 may have a structure in which two layers are stacked or four or more layers are stacked.

Each of the gate electrode G1, the first connection electrode CNE1, and the second connection electrode CNE2 may be formed of a metal material. Each of the gate electrode G1, the first connection electrode CNE1, and the second connection electrode CNE2 may be formed of any one of molybdenum (Mo), aluminum (Al), chromium (Cr), gold (Au), titanium (Ti), nickel (Ni), neodymium (Nd), copper (Cu), and indium tin oxide (ITO), or an alloy thereof. For example, the first sub-layer E1 may include titanium (Ti), the second sub-layer E2 may include copper (Cu), and the third sub-layer E3 may include indium tin oxide (ITO). However, embodiments are not limited thereto.

The first connection electrode CNE1 may be connected to the first conductive pattern layer CPT1 through a first contact hole CH1 formed in the interlayer insulating layer GI and the buffer layer BFL. The first connection electrode CNE1 may be connected to the source S1 through a second contact hole CH2 formed in the interlayer insulating layer GI. Although not illustrated, the first connection electrode CNE1 may be connected to a power line that supplies power to be provided to the light-emitting element OLED. The first voltage may be provided to the transistor T1 through the power line.

The second connection electrode CNE2 may be connected to the second conductive pattern layer CPT2 through a third contact hole CH3 formed in the interlayer insulating layer GI and the buffer layer BFL. The second connection electrode CNE2 may be connected to the drain D1 through a fourth contact hole CH4 formed in the interlayer insulating layer GI. The drain D1, which is a semiconductor pattern layer, may not have high current transmission characteristics. In case that the second conductive pattern layer CPT2 including a metal is connected to the drain D1, the current transmission characteristics of the drain D1 may be improved.

The first insulating layer 10 may be disposed on the gate electrode G1, the first connection electrode CNE1, and the second connection electrode CNE2. The first insulating layer 10 may include an inorganic layer. For example, the first insulating layer 10 may include silicon oxide. The first insulating layer 10 may be disposed on the buffer layer BFL so as to cover the gate electrode G1, the first connection electrode CNE1, and the second connection electrode CNE2.

The second insulating layer 20 may be disposed on the first insulating layer 10. The second insulating layer 20 may include an organic layer. The second insulating layer 20 may provide a flat upper surface. However, embodiments are not limited thereto.

In an embodiment illustrated in FIG. 6, the thickness $t_{NPX}$ of the second insulating layer 20 overlapping the auxiliary conductive layer EL may be smaller than the thickness $t_{PX}$ of the second insulating layer 20 overlapping the light-emitting element OLED. The thickness difference of the second insulating layer 20 may be caused by masks having different transmittances for each region, which is used in the process of forming the first insulating layer 10 and the second insulating layer 20 (e.g., in the process of etching the first insulating layer 10 and the second insulating layer 20 for patterning). For example, the second insulating layer 20 may be collectively etched for each region by using a half tone mask so that the second insulating layer 20 may have different thicknesses. However, embodiments are not limited thereto. For example, the thickness of the second insulating layer 20 may be substantially the same in the light-emitting areas PXA and the non-light-emitting area NPXA.

The display device according to an embodiment may include an auxiliary conductive layer EL in the circuit layer DP-CL. The auxiliary conductive layer EL may be disposed in the non-light-emitting area NPXA. The auxiliary conductive layer EL may be spaced apart from the gate electrode G1. The auxiliary conductive layer EL and the gate electrode G1 may be disposed on the same layer (e.g., interlayer insulating layer GI). At least a portion of the auxiliary conductive layer EL may be exposed through an electrode opening OH-EL formed in the circuit layer DP-CL and the display element layer DP-OL. At least a portion of the auxiliary conductive layer EL may be exposed through the electrode opening OH-EL, and the exposed auxiliary conductive layer EL may be electrically connected to the second electrode CE of the light-emitting element OLED.

The auxiliary conductive layer EL and the gate electrode G1 may be formed of the same material by being patterned by the same process. The auxiliary conductive layer EL may have a structure in which layers are stacked. For example, the auxiliary conductive layer EL may include a first sub-layer E1, a second sub-layer E2, and a third sub-layer E3 which are sequentially stacked. However, embodiments are not limited thereto. For example, the auxiliary conductive layer EL may have a structure in which two layers are stacked or four or more layers are stacked.

The auxiliary conductive layer EL may be formed of a metal material. For example, the auxiliary conductive layer EL and the gate electrode G1 may be formed of the same metal material. The auxiliary conductive layer EL may be formed of any one of molybdenum (Mo), aluminum (Al), chromium (Cr), gold (Au), titanium (Ti), nickel (Ni), neodymium (Nd), copper (Cu), and indium tin oxide (ITO), or an alloy thereof. For example, the first sub-layer E1 may include titanium (Ti), the second sub-layer E2 may include copper (Cu), and the third sub-layer E3 may include indium tin oxide (ITO). However, embodiments are not limited thereto.

The auxiliary conductive layer EL may be disposed on the interlayer insulating layer GI, and the first insulating layer 10 may be disposed on the auxiliary conductive layer EL. The first insulating layer 10 may cover the patterned auxiliary conductive layer EL. The second insulating layer 20 may be disposed on the first insulating layer 10. With respect to the interlayer insulating layer GI, the first insulating layer 10, and the second insulating layer 20, the same contents as described above may be applied.

In this description, as a layer on which the transistor T1 and the auxiliary conductive layer EL are disposed, the layer from the buffer layer BFL to the second insulating layer 20 may be referred to as a circuit layer DP-CL.

The display element layer DP-OL, which includes a light-emitting element OLED and a pixel defining layer PDL, may be disposed on the circuit layer DP-CL. For example, the display element layer DP-OL may include the encapsulation layer TFE disposed on the light-emitting element OLED. FIGS. 5 and 6 illustrate a light-emitting area PXA and a non-light-emitting area NPXA adjacent thereto, but the stacked structure of the light-emitting area PXA and the non-light-emitting area NPXA illustrated in FIGS. 5 and 6 may be equally applied to other portions.

In the display device according to an embodiment, the light-emitting element OLED may include a first electrode AE, a functional layer OL, and a second electrode CE that are sequentially stacked. The functional layer OL may include a hole transport region HCL, a light-emitting layer EML, and an electron transport region ECL.

The first electrode AE of the light-emitting element OLED may be disposed on the second insulating layer 20. The first electrode AE may be connected to the second connection electrode CNE2 through a fifth contact hole CH5 formed in the second insulating layer 20 and the first insulating layer 10. As the first electrode AE is connected to the second connection electrode CNE2, the drain D1 may be connected to the light-emitting element OLED through the second connection electrode CNE2. For example, the second connection electrode CNE2 may be connected to the light-emitting element OLED through the first electrode AE.

The first electrode AE may be formed of a metal material, a metal alloy, or a conductive compound. The first electrode AE may be a transmissive electrode, a semi-transmissive electrode, or a reflective electrode. The first electrode AE may include Ag, Mg, Cu, Al, Pt, Pd, Au, Ni, Nd, Ir, Cr, Li, Ca, LiF/Ca (a stacked structure of LiF and Ca), LiF/Al (a stacked structure of LiF and Al), Mo, Ti, W, or a compound or mixture thereof (e.g., a mixture of Ag and Mg). In another example, the first electrode AE may have a multi-layered structure including a reflective or semi-transmissive film formed of the above material and a transparent conductive film formed of indium tin oxide (ITO), indium zinc oxide (IZO), zinc oxide (ZnO), indium tin zinc oxide (ITZO), or the like. For example, the first electrode AE may include a first layer CL1, a second layer CL2, and a third layer CL3 which are sequentially stacked. For example, the first electrode AE may have a three-layer structure including indium tin oxide (ITO) in the first layer CL1, Ag in the second layer CL2, and indium tin oxide (ITO) in the third layer CL3. However, embodiments are not limited thereto.

The hole transport region HCL may be disposed on the first electrode AE. The hole transport region HCL may have a single layer made of a single material, a single layer made of different materials, or a multi-layered structure having layers made of different materials.

The hole transport region HCL may include at least one of a hole injection layer, a hole transport layer, or an electron blocking layer. For example, the hole transport region HCL may include hole transport layers stacked on one another.

The light-emitting layer EML may be disposed on the hole transport region HCL. The light-emitting layer EML may have a single layer made of a single material, a single layer made of different materials, or a multi-layered structure having layers made of different materials. In an embodiment, the light-emitting layer EML may emit blue light which functions as a source light. However, embodiments are not limited thereto. For example, the display element layer DP-OL may include light-emitting elements OLED including the light-emitting layer EML emitting light of different wavelength regions.

The electron transport region ECL may be disposed on the light-emitting layer EML. The electron transport region ECL may have a single layer made of a single material, a single layer made of different materials, or a multi-layered structure having layers made of different materials. The electron transport region ECL may include at least one of a hole blocking layer, an electron transport layer, or an electron injection layer, but embodiments are not limited thereto.

Each of the hole transport region HCL, the light-emitting layer EML, and the electron transport region ECL may be formed by various methods such as a vacuum deposition method, a spin coating method, a casting method, a Langmuir-Blodgett (LB) method, an inkjet printing method, a laser printing method, and a laser induced thermal imaging (LITI) method.

For example, the functional layer OL, such as the hole transport region HCL, the light-emitting layer EML, and the electron transport region ECL, may be formed by a vacuum deposition method, and due to the material characteristics of the functional layer OL and the characteristics of the vacuum deposition method, the functional layer OL may have a characteristic in which the functional layer OL does not extend to the lower side of an undercut portion and the like. The functional layer OL may be formed by being deposited along the curve and step difference of a layer disposed thereunder, but the functional layer OL may not extend to the lower space of the undercut portion. Thus, the functional layer OL may have a disconnected form due to the protruding portion above the undercut portion.

In the light-emitting element OLED according to an embodiment illustrated in FIGS. 5 and 6, the hole transport region HCL, the light-emitting layer EML, the electron transport region ECL, and the like may be formed as a common layer so as to overlap (e.g., entirely overlap) the light-emitting areas PXA and a non-light-emitting area NPXA. However, embodiments are not limited thereto. For example, the light-emitting layer EML may be formed by being patterned so as to correspond to the light-emitting areas PXA and only a portion of the non-light-emitting area NPXA adjacent to the light-emitting areas PXA.

The second electrode CE may be disposed on the electron transport region ETR. The second electrode CE may be a common electrode. In the light-emitting element OLED according to an embodiment, the second electrode CE may be formed as a common layer so as to overlap (e.g., entirely overlap) the light-emitting areas PXA and the non-light-emitting area NPXA.

The second electrode CE may include Ag, Mg, Cu, Al, Pt, Pd, Au, Ni, Nd, Ir, Cr, Li, Ca, LiF/Ca (a stacked structure of LiF and Ca), LiF/Al (a stacked structure of LiF and Al), Mo, Ti, Yb, W, or a compound or mixture including them (e.g., AgMg, AgYb, or MgYb). In another example, the second electrode CE may have a multi-layered structure including a reflective or semi-transmissive film formed of the above materials and a transparent conductive film formed of indium tin oxide (ITO), indium zinc oxide (IZO), zinc oxide (ZnO), indium tin zinc oxide (ITZO), or the like. For example, the second electrode CE may include the aforementioned metal materials, a combination of two or more metal materials selected from among the aforementioned metal materials, an oxide of the aforementioned metal materials, or the like.

The second electrode CE may be connected to the auxiliary conductive layer EL. In case that the second electrode CE is connected to the auxiliary conductive layer EL, the resistance of the second electrode CE may be reduced.

The second electrode CE may be formed by a vacuum deposition method. For example, the second electrode CE may be formed by conformal deposition. Unlike the functional layer OL, the second electrode CE may extend to the lower space of the undercut portion by a conformal deposition method. In an embodiment, the second electrode CE may extend to the lower space of the undercut portion and a sidewall portion thereof. Thus, in the electrode opening OH-EL, the second electrode CE may be disposed (e.g., directly disposed) on the auxiliary conductive layer EL on which the functional layer OL is not disposed. Accordingly, the second electrode CE may be in contact with the auxiliary conductive layer EL exposed under the undercut portion, and thus a process of forming a separate contact hole for the contacting of the second electrode CE with the auxiliary conductive layer EL may be omitted.

At the time of manufacturing the display device according to an embodiment, a process of forming a contact hole by removing portions of the functional layer OL and the circuit layer DP-CL by a laser drilling method may be omitted. For example, by omitting a contact hole forming process with the use of a laser drilling method in a typical process performed in a process order in which the functional layer OL is deposited, the portions of the functional layer OL and the circuit layer DP-CL are removed by the laser drilling method so that the auxiliary conductive layer EL may be exposed, and the second electrode CE is deposited so as to cover the functional layer OL and the auxiliary conductive layer EL exposed through the contact hole, and by the same process of deposition, masking, etching, or the like as used at the time of forming the circuit layer DP-CL and the display element layer DP-OL. Thus, the second electrode CE and the auxiliary conductive layer EL may be in contact with each other. Accordingly, the laser drilling process performed between the deposition of the functional layer OL and the deposition of the second electrode CE may be omitted, thereby improving process productivity and process efficiency.

Referring to FIGS. 5 and 6, the display element layer DP-OL may include a pixel defining layer PDL disposed on the circuit layer DP-CL. The pixel defining layer PDL may be disposed on the second insulating layer 20. A pixel opening OH-PX may be formed in the pixel defining layer PDL in the light-emitting area PXA. A portion of the first electrode AE may be exposed through the pixel opening OH-PX. For example, the light-emitting area PXA may be defined by the exposed portion of the first electrode AE. In an embodiment, an upper opening OH-T of the electrode opening OH-EL may be formed in the pixel defining layer PDL so as to disposed in the non-light-emitting area NXPA.

The pixel defining layer PDL may include an organic material. For example, the pixel defining layer PDL may include a polyacrylate-based resin or a polyimide-based resin, but the material of the pixel defining layer PDL is not limited to the above examples. For example, the pixel defining layer PDL may be formed of an inorganic material. For example, the pixel defining layer PDL may include silicon nitride ($SiN_x$), silicon oxide ($SiO_x$), silicon oxynitride ($SiO_xN_y$), and the like, but the material of the pixel defining layer PDL is not limited to the above examples.

The pixel defining layer PDL may include a light absorbing material or have a certain color. For example, the pixel defining layer PDL may include a base resin and a black pigment and/or a black dye mixed with the base resin.

The encapsulation layer TFE may cover the light-emitting element OLED. The encapsulation layer TFE may seal the display element layer DP-OL. The encapsulation layer TFE may be a thin-film encapsulation layer. The encapsulation layer TFE may be a single layer or a stack of layers. The encapsulation layer TFE may include at least one insulating layer. The encapsulation layer TFE according to an embodiment may include at least one inorganic film (hereinafter, referred to as an inorganic encapsulation film). For example, the encapsulation layer TFE according to an embodiment may include at least one organic film (hereinafter, referred to as an organic encapsulation film) and at least one inorganic encapsulation film.

The inorganic encapsulation film may protect the display element layer DP-OL from moisture/oxygen, and the organic encapsulation film may protect the display element layer DP-OL from foreign substances such as dust particles. The inorganic encapsulation film may include silicon nitride, silicon oxynitride, silicon oxide, titanium oxide, aluminum oxide, or the like. However, embodiments are not limited thereto. The organic encapsulation film may include an acrylic-based compound, an epoxy-based compound, or the like. The organic encapsulation film may include a photopolymerizable organic material and embodiments are not limited thereto.

Referring to FIG. 6, in the display panel DP according to an embodiment, an electrode opening OH-EL disposed in (or overlapping) the non-light-emitting area NPXA may be formed in the circuit layer DP-CL and the pixel defining layer PDL so that at least a portion of the auxiliary conductive layer EL may be exposed. A protruding edge portion PD-ED of the pixel defining layer PDL defining the electrode opening OH-EL may not overlap the first insulating layer 10 and may protrude toward inside of the electrode opening OH-EL. In an embodiment, the protruding edge portion PD-ED of the pixel defining layer PDL may have a shape protruding more toward inside of the electrode opening OH-EL than a side edge portion of the first insulating layer 10 which defines the electrode opening OH-EL. In an embodiment, the first insulating layer 10 may not be disposed under the protruding edge portion PD-ED of the pixel defining layer PDL, and thus the electrode opening OH-EL may have a step difference because a side surface defining a portion of an opening region is not continuous (or aligned) with a side surface defining another opening region, thereby forming an undercut shape under the protruding edge portion PD-ED.

At the end portion of the protruding edge portion PD-ED, each of the functional layer OL and the second electrode CE of the light-emitting element OLED may be disconnected. In an embodiment, a portion of the second electrode CE disconnected from the electrode opening OH-EL under the protruding edge portion PD-ED may be electrically connected to the auxiliary conductive layer EL.

Figure 7:
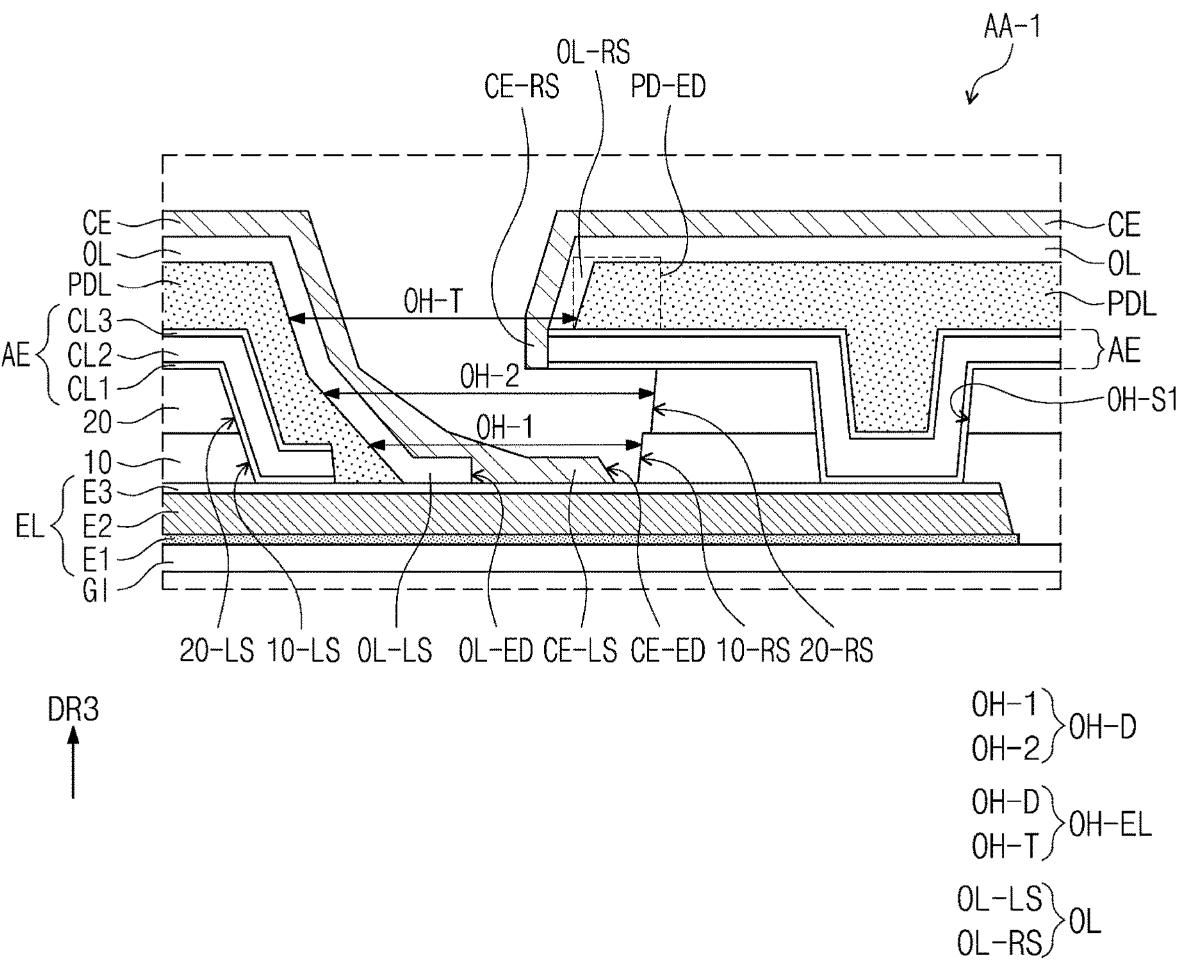
FIG. 7 is a schematic enlarged cross-sectional view of a portion of the display panel according to an embodiment.

FIG. 7 is a schematic cross-sectional view illustrating a portion of the display device according to an embodiment. FIGS. 8A to 8D illustrate a part of a manufacturing step of the display device according to an embodiment. FIG. 7 illustrates a portion of the display device manufactured by the steps of FIGS. 8A to 8D, and FIG. 7 may illustrate a portion corresponding to the region AA-1 in the display panel DP of FIG. 8D.

In the display device according to an embodiment, each of the functional layer OL and the second electrode CE in the electrode opening OH-EL may not continuously extend and may be disconnected. A first end portions CE-LS of the disconnected second electrode CE, which is positioned inside of the electrode opening OH-EL, may be disposed on the upper surface of the auxiliary conductive layer EL, and a second end portions CE-RS of the disconnected second electrode CE, which is positioned inside of the electrode opening OH-EL, may be in contact with the first electrode AE disposed on the lower surface of the protruding edge portion PD-ED. In an embodiment, the first end portions CE-LS of the second electrode CE may be disposed (e.g., directly disposed) on the upper surface of the auxiliary conductive layer EL, and the second end portions CE-RS of the second electrode CE may be disposed (e.g., directly disposed) on the exposed side surface of the first electrode AE.

In an embodiment, the second electrode CE may be in contact with the auxiliary conductive layer EL at least two points. In an embodiment, the first end portion CE-LS of the disconnected second electrode CE may be disposed (e.g., directly disposed) on the upper surface of the auxiliary conductive layer EL so as to be electrically connected to the auxiliary conductive layer EL, and the second end portion CE-RS of the disconnected second electrode CE may be electrically connected to the auxiliary conductive layer EL through the first electrode AE. The first end portion CE-LS of the second electrode CE may be disposed (e.g., directly disposed) on the third sub-layer E3 of the auxiliary conductive layer EL.

In an embodiment, on a cross section perpendicular to the base substrate BS, a first side surface 10-RS of the first insulating layer 10 and a first side surface 20-RS of the second insulating layer 20 may be exposed through the electrode opening OH-EL, and a second side surface 10-LS of the first insulating layer 10 and a second side surface 20-LS of the second insulating layer 20 may be covered by the first electrode AE and the pixel defining layer PDL which are sequentially stacked.

In an embodiment, the electrode opening OH-EL may include a lower opening OH-D formed to overlap the auxiliary conductive layer EL and an upper opening OH-T formed above the lower opening OH-D. In an embodiment, the lower opening OH-D may include a first sub-opening OH-1 and a second sub-opening OH-2. The first sub-opening OH-1 may be formed as a space between the first side surface 10-RS of the first insulating layer 10 exposed under the protruding edge portion PD-ED and the pixel defining layer PDL disposed on the second side surface 10-LS of the first insulating layer 10. For example, the second sub-opening OH-2 may be formed as a space between the first side surface 20-RS of the second insulating layer 20 exposed under the protruding edge portion PD-ED and the pixel defining layer PDL disposed on the second side surface 20-LS of the second insulating layer 20.

In an embodiment, the electrode opening OH-EL may include: the lower opening OH-D which is formed as a space between the first side surface 20-RS of the second insulating layer 20 exposed under the protruding edge portion PD-ED and the pixel defining layer PDL disposed on the second side surface 20-LS of the second insulating layer 20; and the upper opening OH-T formed in the pixel defining layer PDL above the lower opening OH-D.

In an embodiment, a first end portion OL-LS of the disconnected functional layer OL may cover the pixel defining layer PDL covering the second side surface 20-LS of the second insulating layer 20 in the lower opening OH-D. For example, a second end portion OL-RS of the disconnected functional layer OL may cover the pixel defining layer PDL defining the upper opening OH-T. In an embodiment, an end edge portion CE-ED of the disconnected second electrode CE may protrude more toward inside of the lower opening OH-D than an end edge portion OL-ED of the disconnected functional layer OL. The end edge portion CE-ED of the second electrode CE may not overlap the functional layer OL, and the end edge portion CE-ED of the second electrode CE may be disposed (e.g., directly disposed) on the upper surface of the auxiliary conductive layer EL.

In an embodiment, the first electrode AE may be disposed under the pixel defining layer PDL. For example, the first electrode AE may include first, second, and third layers CL1, CL2, and CL3 which are sequentially stacked.

The first electrode AE may be disposed on the lower surface of the protruding edge portion PD-ED disposed in the electrode opening OH-EL, and the lower surface of the first electrode AE overlapping the protruding edge portion PD-ED may not overlap the second insulating layer 20. Accordingly, the electrode opening OH-EL may include a portion having an undercut shape under the first electrode AE.

In the lower opening OH-D, unlike the functional layer OL, the second electrode CE may extend to a portion under the protruding edge portion PD-ED, which is a portion having an undercut shape, and may sufficiently be in contact with the auxiliary conductive layer EL exposed under the protruding edge portion PD-ED. In an embodiment, the second electrode CE may be in contact with the first electrode AE exposed through the electrode opening OH-EL, and the first electrode AE may be electrically connected to the auxiliary conductive layer EL through an auxiliary opening OH-S1 spaced apart from the electrode opening OH-EL and formed in the first and second insulating layers 10 and 20. Accordingly, the display device according to an embodiment may have improved voltage stability, uniform luminance characteristics even in the case of a large area, and excellent reliability as the second electrode CE is electrically connected to the auxiliary conductive layer EL.

For example, the pixel defining layer PDL may be disposed between the first electrode AE and the functional layer OL in the auxiliary opening OH-S1. The pixel defining layer PDL may fill the auxiliary opening OH-S1.

Figures 8A, 8B:
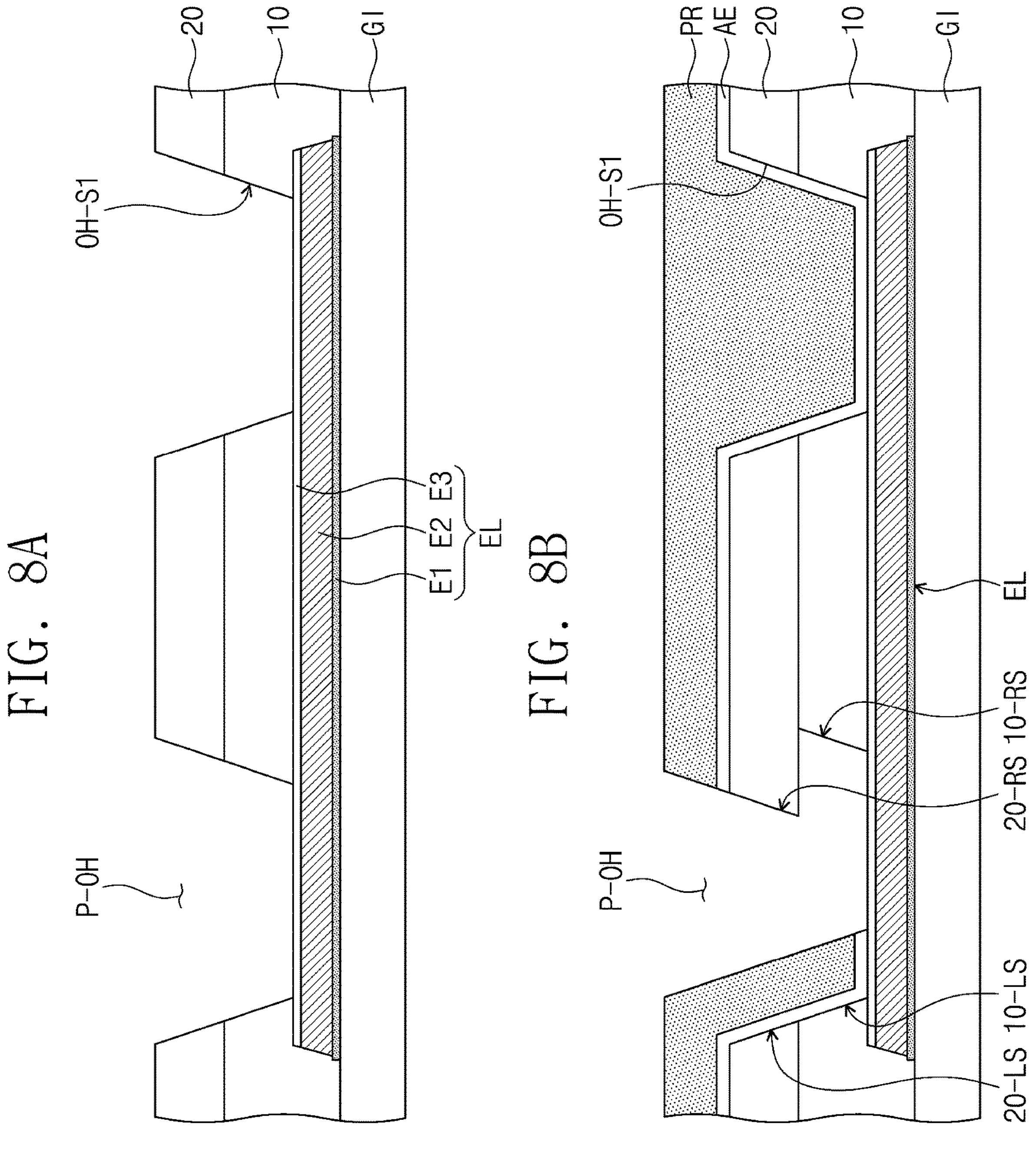
FIGS. 8A, 8B, 8C, and 8D illustrate steps of a method of manufacturing the display device according to an embodiment.

FIG. 8A illustrates a step of forming the first insulating layer 10 and the second insulating layer 20 in a manufacturing process of the display device according to an embodiment. In an embodiment, the auxiliary conductive layer EL may be formed by being patterned on the interlayer insulating layer GI. For example, the auxiliary conductive layer EL and the gate electrode G1 may be formed by being patterned in the same process (see FIG. 1). The first insulating layer 10 and the second insulating layer 20 may be sequentially formed on the patterned auxiliary conductive layer EL, and the first insulating layer 10 and the second insulating layer 20 may be patterned by an etching process. A halftone mask may be used to pattern the first insulating layer 10 and the second insulating layer 20, and the thickness of the second insulating layer 20 overlapping the auxiliary conductive layer EL may be smaller than the thickness of the second insulating layer 20 overlapping the light-emitting area PXA (see FIG. 6). Openings P-OH and OH-S1 through which at least a portion of the auxiliary conductive layer EL is exposed may be formed by patterning the first insulating layer 10 and the second insulating layer 20. Hereafter, a preliminary opening P-OH may be transformed into the electrode opening OH-EL by an additional process. For example, the auxiliary opening OH-S1 may be spaced apart from the preliminary opening P-OH.

Referring to FIG. 8B, a first electrode AE may be deposited on the patterned second insulating layer 20, a photoresist PR may be coated on the first electrode AE, and the first electrode AE may be patterned by a development and exposure process so that the auxiliary conductive layer EL may be exposed.

After the first electrode AE is patterned, the first insulating layer 10 may be partially removed by etching solution, and as the first side surface 10-RS of the first insulating layer 10 is positioned more inward than the first side surface 20-RS of the second insulating layer 20, the first side surface 10-RS of the first insulating layer 10 may not coincide (or be aligned) with the first side surface 20-RS of the second insulating layer 20 and may overlap the second insulating layer 20. After the patterning of the first electrode AE and the partial etching of the first insulating layer 10 are performed, the first side surface 10-RS of the first insulating layer 10 and the first side surface 20-RS of the second insulating layer 20 may be exposed through the preliminary opening P-OH, and the second side surface 10-LS of the first insulating layer 10 and the second side surface 20-LS of the second insulating layer 20 may be covered by the first electrode AE.

Figures 8C, 8D:
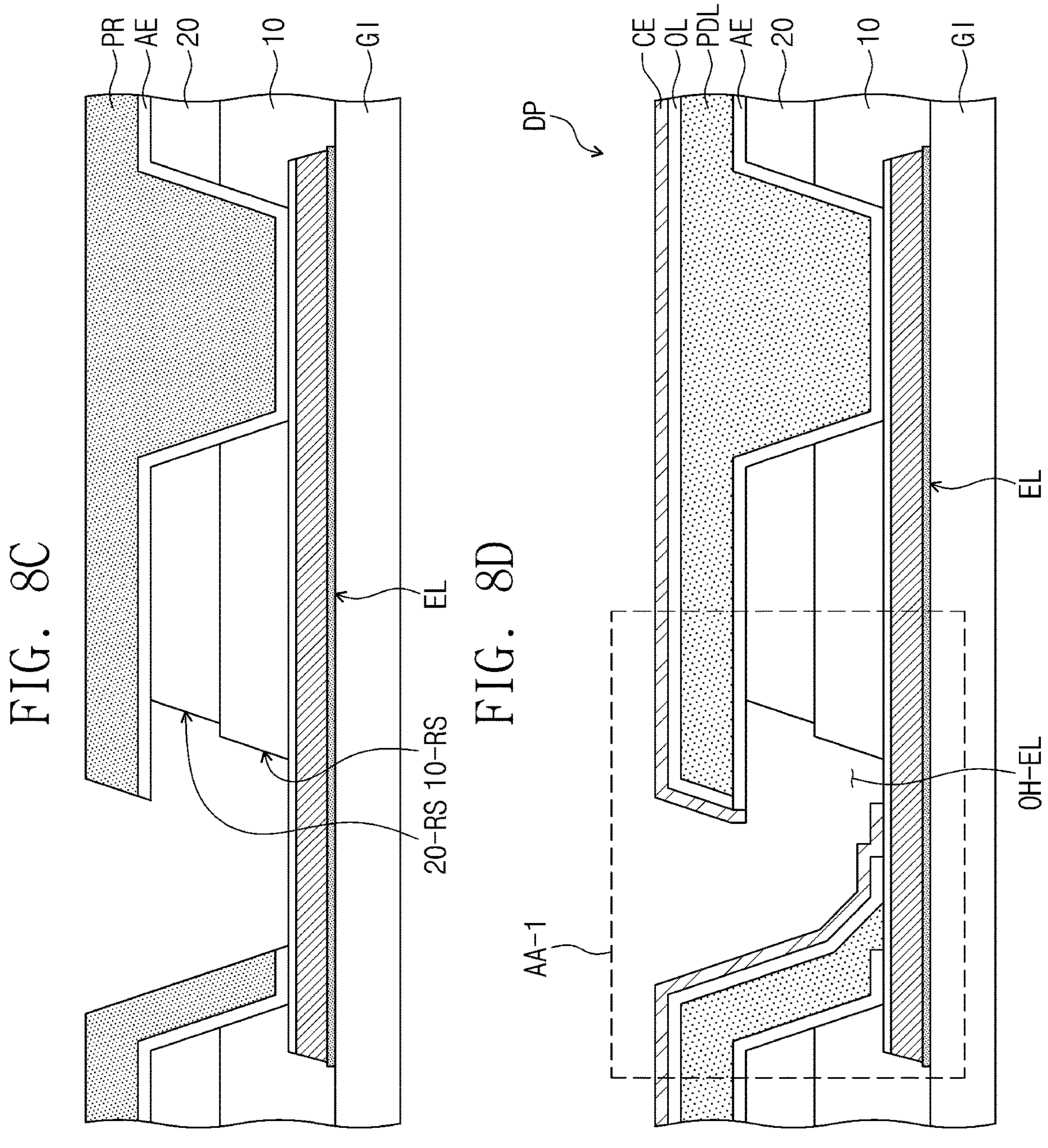

FIG. 8C illustrates a state in which the second insulating layer 20 is additionally etched. After the patterning of the first electrode AE is performed, the first side surface 20-RS of the second insulating layer 20 may be additionally removed in an ashing process. After the ashing process is performed, the first side surface 20-RS of the second insulating layer 20 may be formed by moving more toward the auxiliary opening OH-S1 than the first side surface 10-RS of the first insulating layer 10. The first side surface 20-RS of the second insulating layer 20 may not coincide (or be aligned) with the first side surface 10-RS of the first insulating layer 10 and may overlap the first insulating layer 10. However, embodiments are not limited thereto. For example, the additional etching process of the second insulating layer 20 may be omitted.

FIG. 8D illustrates a step of removing the photoresist PR and forming the pixel defining layer PDL, the functional layer OL, and the second electrode CE sequentially after patterning the first insulating layer 10 and the second insulating layer 20 as illustrated in FIG. 8C. The pixel defining layer PDL may be disposed on the first electrode AE. The functional layer OL and the second electrode CE may be disposed on the pixel defining layer PDL. Referring to FIGS. 7 and 8D, unlike the deposited form of the functional layer OL, the second electrode CE may extend from the electrode opening OH-EL to the lower side of the protruding edge portion PD-ED. The second electrode CE may cover the functional layer OL, and an end portion of the second electrode CE may be in contact with the auxiliary conductive layer EL or the first electrode AE.

In the display panel DP according to an embodiment, which is manufactured according to the steps illustrated in FIGS. 8A to 8D, the second electrode CE and the auxiliary conductive layer EL may stably be in contact with each other by the patterning process of the first insulating layer 10, the second insulating layer 20, and the first electrode AE without a process of forming a separate contact hole for the contacting of the second electrode CE with the auxiliary conductive layer EL. As the second electrode CE and the auxiliary conductive layer EL may sufficiently be in contact with each other by a process of forming the elements of the circuit layer or the display element layer of the display panel without an additional process by using separate equipment, the process may be simplified and thus may have excellent process ability.

Hereinafter, a display device according to an embodiment will be described with reference to FIGS. 9 to 14D. With respect to the display device according to an embodiment, which is described with reference to FIGS. 9 to 14D, the same content as those described with reference to FIGS. 1 to 8D will not be described, and differences will be described. FIGS. 9 to 14D illustrate a portion of a region corresponding to a non-light-emitting area in which an auxiliary conductive layer is disposed, and the stacked structure of the light-emitting area and the non-light-emitting area adjacent to the light-emitting area may be the same as what is illustrated in FIG. 6.

Figure 9:
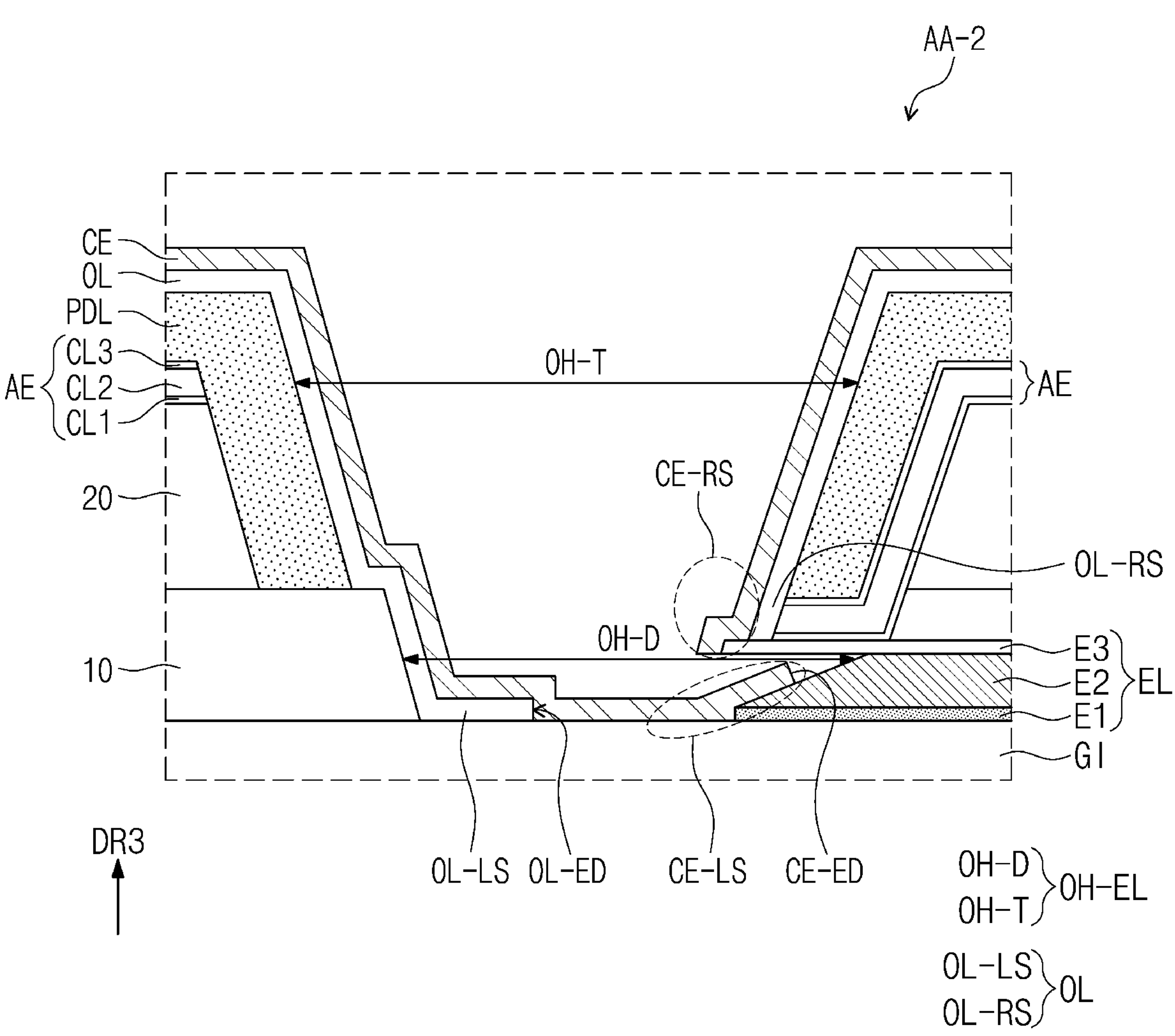
FIG. 9 is a schematic enlarged cross-sectional view of a portion of a display panel according to an embodiment.
Figures 10A, 10B:
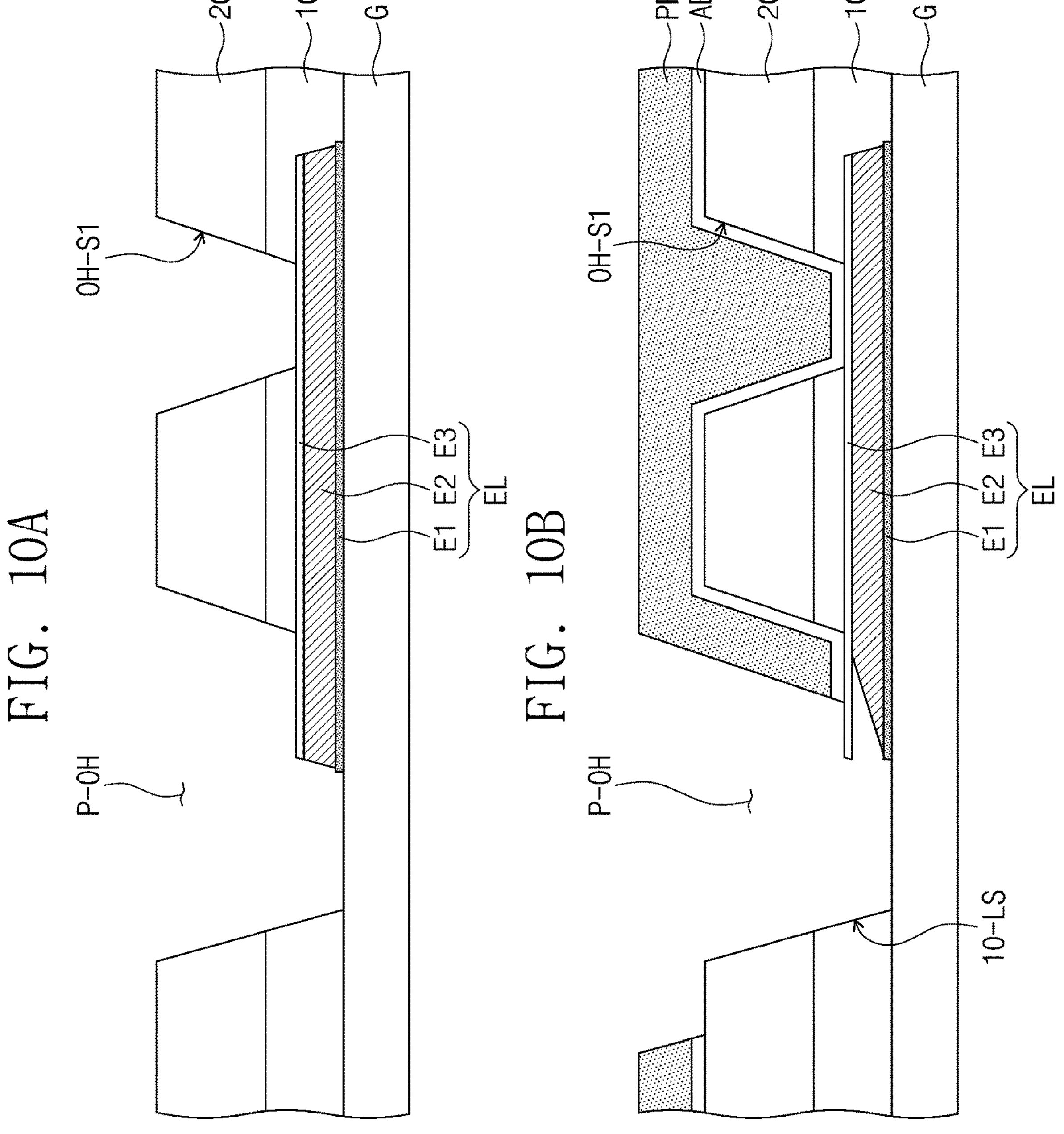
FIGS. 10A, 10B, and 10C illustrate steps of a method of manufacturing a display device according to an embodiment.
Figure 10C:
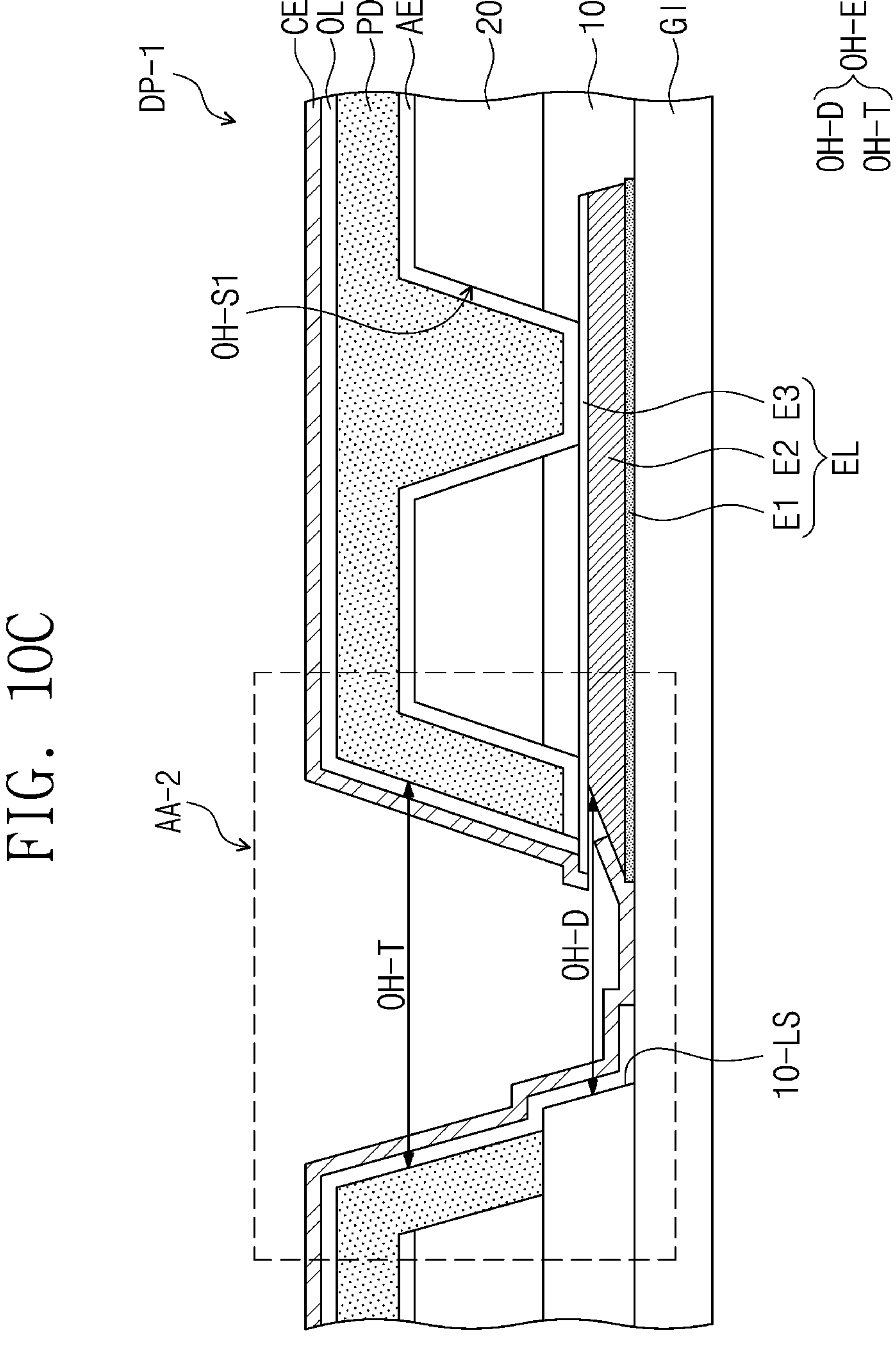

FIG. 9 is a schematic cross-sectional view illustrating a portion of a display device according to an embodiment. FIGS. 10A to 10C illustrate a part of a manufacturing step of the display device according to an embodiment. FIG. 9 illustrates a portion of the display device manufactured by the steps of FIGS. 10A to 10C, and FIG. 9 may illustrate a portion corresponding to the region AA-2 of a display panel DP-1 of FIG. 10C.

In the display device according to an embodiment, the protruding edge portion PD-ED of the pixel defining layer PDL defining the electrode opening OH-EL may not overlap the first insulating layer 10 and may protrude toward inside of the electrode opening OH-EL. In an embodiment, the first insulating layer 10 may not be disposed under the protruding edge portion PD-ED of the pixel defining layer PDL, and thus the electrode opening OH-EL may have a step difference because a side surface defining a portion of an opening region is not continuous (or aligned) with a side surface defining another opening region, thereby forming an undercut shape under the protruding edge portion PD-ED.

Referring to FIG. 9, in the electrode opening OH-EL, each of the functional layer OL and the second electrode CE may be disconnected without being continuous. At least a portion of the auxiliary conductive layer EL may be exposed through the electrode opening OH-EL. The first end portion CE-LS of the disconnected second electrode CE, which is positioned inside of the electrode opening OH-EL, may be disposed on a side surface of the auxiliary conductive layer EL, and the second end portion CE-RS of the disconnected second electrode CE, which is positioned inside of the electrode opening OH-EL, may be disposed on the upper surface of the auxiliary conductive layer EL disposed under the protruding edge portion PD-ED.

In an embodiment, the auxiliary conductive layer EL may include a first sub-layer E1, a second sub-layer E2, and a third sub-layer E3 which are sequentially stacked, and the first end portion CE-LS of the disconnected second electrode CE may be in contact with the second sub-layer E2, and the second end portion CE-RS of the disconnected second electrode CE may be in contact with the third sub-layer E3. For example, the first end portion CE-LS of the disconnected second electrode CE may be disposed (e.g., directly disposed) on the exposed side surface of the second sub-layer E2 including copper (Cu), and the second end portion CE-RS of the disconnected second electrode CE may not be covered by the pixel defining layer PDL and the functional layer OL and may be disposed (e.g., directly disposed) on a portion of the third sub-layer E3 including indium tin oxide (ITO).

In an embodiment, on a cross section perpendicular to the base substrate BS, the second side surface 10-LS of the first insulating layer 10 may be exposed through the electrode opening OH-EL, and the first side surface 10-RS of the first insulating layer 10, the first side surface 20-RS of the second insulating layer 20, and the second side surface 20-LS of the second insulating layer 20 may be covered by the pixel defining layer PDL.

The electrode opening OH-EL may include a lower opening OH-D and an upper opening OH-T. The lower opening OH-D may be formed as a space between the second sub-layer E2 exposed under the protruding edge portion PD-ED and the second side surface 10-LS of the first insulating layer 10. The upper opening OH-T may be a space above the lower opening OH-D and may be formed in the pixel defining layer PDL. The upper opening OH-T may be formed in the pixel defining layer PDL disposed on and covering the second insulating layer 20.

The lower opening OH-D may overlap the upper opening OH-T. However, a portion of the lower opening OH-D may overlap the protruding edge portion PD-ED portion, and the lower opening OH-D region overlapping the protruding edge portion PD-ED may be referred to as an undercut portion. In the undercut portion, the second electrode CE may be in contact with (e.g., in directly contact with) the exposed second sub-layer E2.

In an embodiment, the first end portion OL-LS of the disconnected functional layer OL may cover the second side surface 10-LS of the first insulating layer 10 in the lower opening OH-D, and the second end portion OL-RS of the functional layer OL may be disposed on the pixel defining layer PDL defining the upper opening OH-T.

The end edge portion CE-ED of the disconnected second electrode CE may protrude more toward inside of the lower opening OH-D than the end edge portion OL-ED of the disconnected functional layer OL, and the end edge portion CE-ED of the second electrode CE may be disposed (e.g., directly disposed) on the side surface of the auxiliary conductive layer EL.

In an embodiment, the first end portion CE-LS of the second electrode CE may be disposed (e.g., directly disposed) on the inclined side surface of the second sub-layer E2 of the auxiliary conductive layer EL, and the second end portion CE-RS of the disconnected second electrode CE may be in contact with a side surface of the third sub-layer E3 overlapping the protruding edge portion PD-ED.

In an embodiment, the second electrode CE may be in contact with the auxiliary conductive layer EL at least two points. In an embodiment, the first end portion CE-LS of the disconnected second electrode CE mat be disposed (e.g., directly disposed) on the side surface of the auxiliary conductive layer EL so as to be electrically connected to the auxiliary conductive layer EL, and the second end portion CE-RS of the disconnected second electrode CE may be electrically connected to the auxiliary conductive layer EL through the third sub-layer E3 of the contacted auxiliary conductive layer EL. The first end portion CE-LS of the second electrode CE may be disposed (e.g., directly disposed) on the third sub-layer E3 of the auxiliary conductive layer EL.

FIG. 10A illustrates a step of forming the first insulating layer 10 and the second insulating layer 20 among the manufacturing steps of the display device according to an embodiment. In an embodiment, the auxiliary conductive layer EL may be formed by being patterned on the interlayer insulating layer GI. For example, the auxiliary conductive layer EL and the gate electrode G1 may be formed by being patterned in the same process (see FIG. 1). The first insulating layer 10 and the second insulating layer 20 may be sequentially disposed on the patterned auxiliary conductive layer EL, and the first insulating layer 10 and the second insulating layer 20 may be patterned by an etching process. The openings P-OH and OH-S1, through which at least a portion of the auxiliary conductive layer EL is exposed, may be formed by patterning the first insulating layer 10 and the second insulating layer 20. Hereafter, the preliminary opening P-OH may be transformed into the electrode opening OH-EL by an additional process. For example, the auxiliary opening OH-S1 may be spaced apart from the preliminary opening P-OH. When compared to the steps of the method of manufacturing the display device according to the embodiment illustrated in FIG. 8A, what is different is that in an embodiment illustrated in FIG. 10A, a portion of the side surface of the auxiliary conductive layer EL is exposed through the preliminary opening P-OH.

Referring to FIG. 10B, the first electrode AE may be deposited on the patterned second insulating layer 20, the photoresist PR may be coated on the first electrode AE, and the first electrode AE may be patterned by a development and exposure process so that the auxiliary conductive layer EL may be exposed. In the step illustrated in FIG. 10B, the second side surface 10-LS of the first insulating layer 10 and the second side surface 20-LS of the second insulating layer 20 may be exposed through the preliminary opening P-OH, and the first side surface 10-RS of the first insulating layer 10 and the first side surface 20-RS of the second insulating layer 20 may be covered by the first electrode AE. The first electrode AE may be developed and exposed by using the coated photoresist PR and patterned by performing an etching process. The second sub-layer E2 of the auxiliary conductive layer EL may be partially etched by the etching solution used in case that the first electrode AE is etched. For example, the etching solution used in the etching of the first electrode AE may selectively etch copper (Cu), and accordingly, only the second sub-layer E2 between the first sub-layer E1 and the third sub-layer E3 in the auxiliary conductive layer EL may be partially etched so that the exposed side surface of the second sub-layer E2 may be disposed under the protruding edge portion PD-ED (see FIG. 9). According to the selective etching of the second sub-layer E2, the third sub-layer E3 may be positioned to protrude toward inside of the preliminary opening P-OH.

FIG. 10C illustrates a step of removing the photoresist PR and sequentially forming the pixel defining layer PDL, the functional layer OL, and the second electrode CE after patterning the first insulating layer 10, the second insulating layer 20, and the first electrode AE as illustrated in FIG. 10B. The pixel defining layer PDL may be disposed on the first electrode AE, and the functional layer OL and the second electrode CE may be disposed on the pixel defining layer PDL. When compared to the embodiment illustrated in FIG. 7, what is different is that in the case of the display panel DP-1 according to an embodiment, the protruding edge portion PD-ED of the pixel defining layer PDL is disposed on the third sub-layer E3. Referring to FIGS. 9 and 10C, unlike the deposited form of the functional layer OL, the second electrode CE may extend from the electrode opening OH-EL to the lower side of the protruding edge portion PD-ED. The second electrode CE may cover the functional layer OL, and an end portion of the second electrode CE may be in contact with the second sub-layer E2 or the third sub-layer E3 of the auxiliary conductive layer EL. For example, the first electrode AE may be spaced apart from the electrode opening OH-EL and electrically connected to the auxiliary conductive layer EL through the auxiliary opening OH-S1 formed in the first and second insulating layers 10 and 20.

The display panel DP-1 according to an embodiment, which is manufactured in the steps of FIGS. 10A to 10C, may have improved voltage stability, uniform luminance characteristics even in the case of a large area, and excellent reliability as the first end portion CE-LS of the disconnected second electrode CE is electrically connected to the second sub-layer E2 and the second end portion CE-RS of the disconnected second electrode CE is electrically connected to the third sub-layer E3.

Like the embodiment described with reference to FIGS. 8A to 8D, a method of manufacturing the display device according to an embodiment, which proceeds with the steps of FIGS. 10A to 10C, makes it possible for the second electrode CE and the auxiliary conductive layer EL to stably be in contact with each other by a process of patterning the first insulating layer 10, the second insulating layer 20, the first electrode AE, and the like without a process of forming a separate contact hole for the contacting of the second electrode CE with the auxiliary conductive layer EL, and therefore, the process may be simplified. Accordingly, the method of manufacturing the display device according to an embodiment may have excellent processability.

Figure 11:
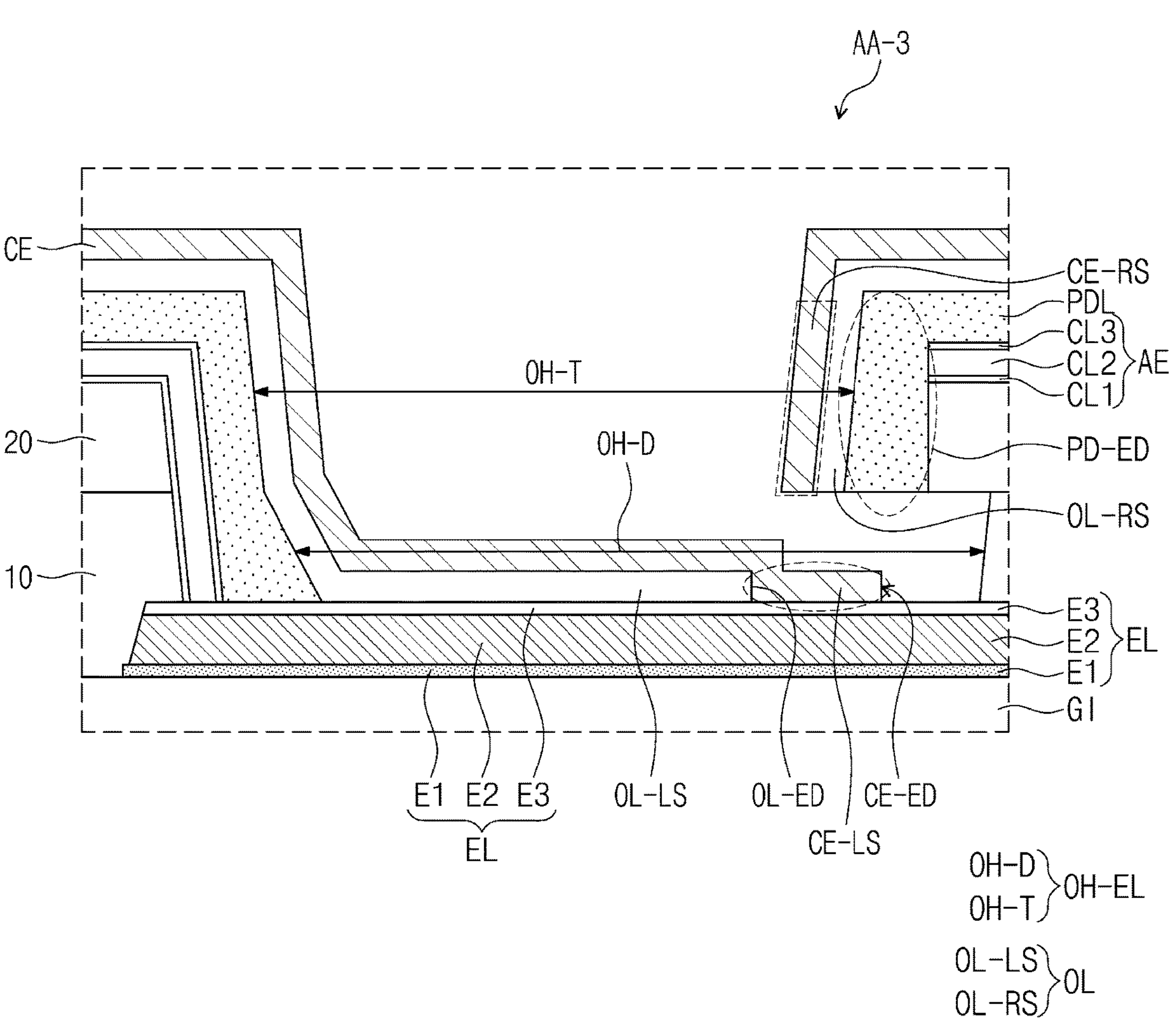
FIG. 11 is a schematic enlarged cross-sectional view of a portion of a display panel according to an embodiment.

FIG. 11 is a schematic cross-sectional view illustrating a portion of the display device according to an embodiment. FIGS. 12A to 12D illustrate a part of a manufacturing step of the display device according to an embodiment. FIG. 11 illustrates a portion of the display device manufactured by the steps of FIGS. 12A to 12D, and FIG. 11 may illustrate a portion corresponding to the region AA-3 in a display panel DP-2 of FIG. 12D.

In the display device according to an embodiment, the protruding edge portion PD-ED of the pixel defining layer PDL defining the electrode opening OH-EL may not overlap the first insulating layer 10 and may protrude toward inside of the electrode opening OH-EL. In an embodiment, the first insulating layer 10 may not be disposed under the protruding edge portion PD-ED of the pixel defining layer PDL, and thus the electrode opening OH-EL may have a step difference because a side surface defining a portion of an opening region is not continuous (or aligned) with a side surface defining another opening region, thereby having an undercut shape under the protruding edge portion PD-ED.

In an embodiment, on a cross section perpendicular to the base substrate BS, the first side surface 10-RS of the first insulating layer 10 may be exposed through the electrode opening OH-EL, and the second side surface 10-LS of the first insulating layer 10, the first side surface 20-RS of the second insulating layer 20, and the second side surface 20-LS of the second insulating layer 20 may be covered by the pixel defining layer PDL. The electrode opening OH-EL may include a lower opening OH-D and an upper opening OH-T formed above the lower opening OH-D. The lower opening OH-D may be formed as a space between the first side surface 10-RS of the first insulating layer 10 exposed under the protruding edge portion PD-ED of the pixel defining layer PDL and the pixel defining layer PDL covering the second side surface 10-LS of the first insulating layer 10. The upper opening OH-T may be formed as a space between the pixel defining layers PDL disposed above the lower opening OH-D. The functional layer OL may cover the pixel defining layer PDL exposed through the electrode opening OH-EL, and the second electrode CE may cover the functional layer OL.

Referring to FIG. 11, in the electrode opening OH-EL, each of the functional layer OL and the second electrode CE may not be continuous and may be disconnected. At least a portion of the auxiliary conductive layer EL may be exposed through the electrode opening OH-EL. The first end portion CE-LS of the disconnected second electrode CE, which is positioned inside of the electrode opening OH-EL, may be disposed on the upper surface of the auxiliary conductive layer EL, and the second end portion CE-RS of the disconnected second electrode CE, which is positioned inside of the electrode opening OH-EL, may be disposed on the pixel defining layer PDL defining the electrode opening OH-EL.

In an embodiment, the first end portion OL-LS of the disconnected functional layer OL may be disposed (e.g., directly disposed) on the upper surface of the auxiliary conductive layer EL in the lower opening OH-D, and the first end portion CE-LS of the disconnected second electrode CE may cover the first end portion OL-LS of the functional layer OL in the lower opening OH-D. As the end edge portion CE-ED of the disconnected second electrode CE protrudes more toward inside of the lower opening than the end edge portion OL-ED of the disconnected functional layer OL, the end edge portion CE-ED of the second electrode CE may be disposed (e.g., directly disposed) on the auxiliary conductive layer EL.

In an embodiment, the first end portion CE-LS of the disconnected second electrode CE may be disposed (e.g., directly disposed) on the upper surface of the auxiliary conductive layer EL, and the second end portion CE-RS of the disconnected second electrode CE may be insulated from the first electrode AE and the auxiliary conductive layer EL by the pixel defining layer PDL. Accordingly, in the case of the display device according to an embodiment illustrated in FIG. 11, what is different from the embodiment illustrated in FIGS. 7 and 9 is that the second electrode CE is in contact with the auxiliary conductive layer EL at a point.

Figures 12A, 12B:
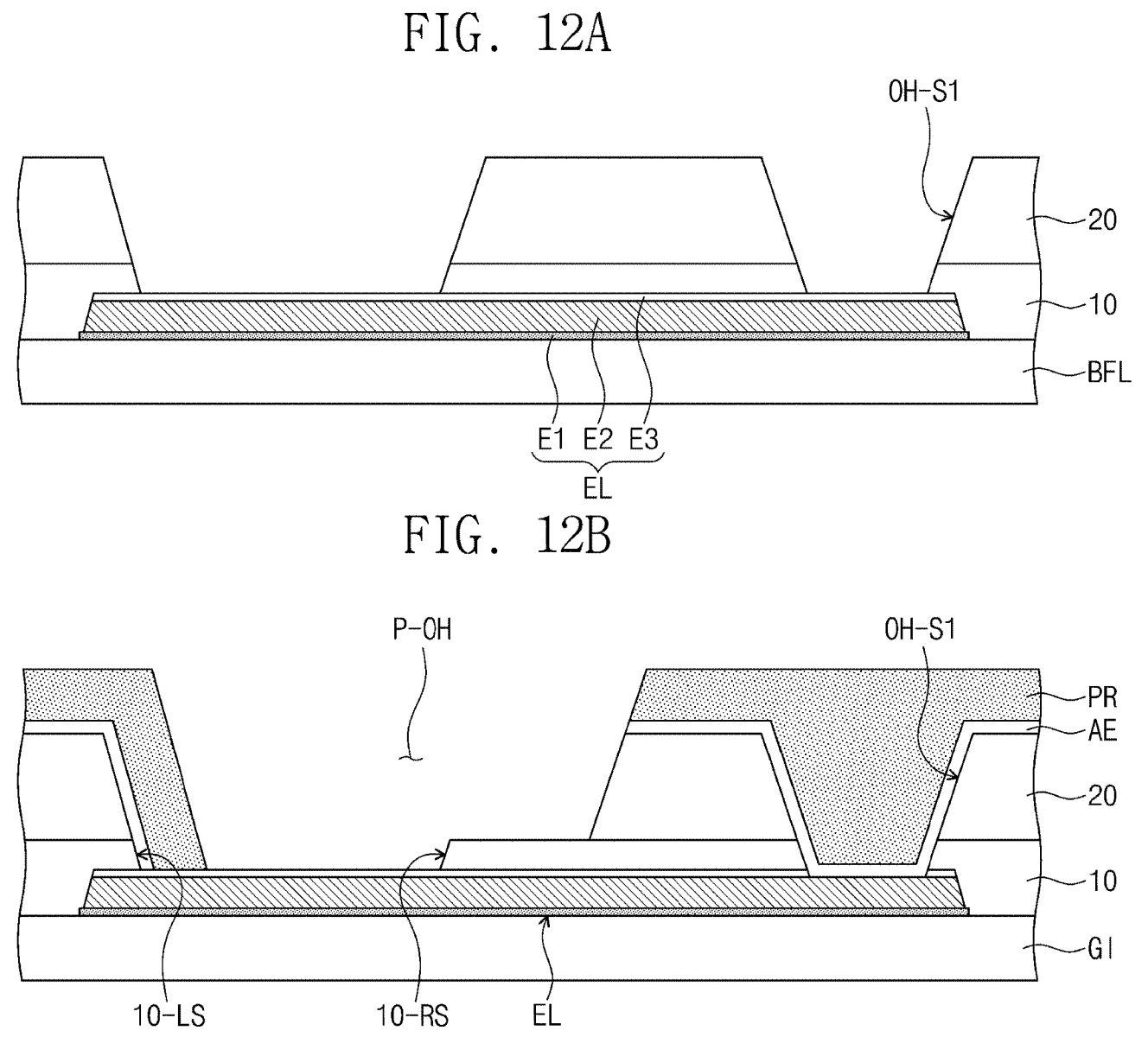

FIG. 12A illustrates a step of forming the first insulating layer 10 and the second insulating layer 20 among the manufacturing steps of the display device according to an embodiment. In an embodiment, the auxiliary conductive layer EL may be formed by being patterned on the interlayer insulating layer GI. For example, the auxiliary conductive layer EL and the gate electrode G1 may be formed by being patterned in the same process (see FIG. 1). The first insulating layer 10 and the second insulating layer 20 may be sequentially formed on the patterned auxiliary conductive layer EL, and the first insulating layer 10 and the second insulating layer 20 may be patterned by an etching process.

The openings P-OH and OH-S1, through which at least a portion of the auxiliary conductive layer EL is exposed, may be formed by patterning the first insulating layer 10 and the second insulating layer 20. The preliminary opening P-OH may be transformed into the electrode opening OH-EL by an additional process. For example, the auxiliary opening OH-S1 may be spaced apart from the preliminary opening P-OH.

Referring to FIG. 12B, the first electrode AE may be deposited on the patterned second insulating layer 20, the photoresist PR may be coated on the first electrode AE, and the first electrode AE and the second insulating layer 20 may be patterned so that portions of the upper surfaces of the auxiliary conductive layer EL and the first insulating layer 10 may be exposed by a development and exposure process.

Figure 12C:
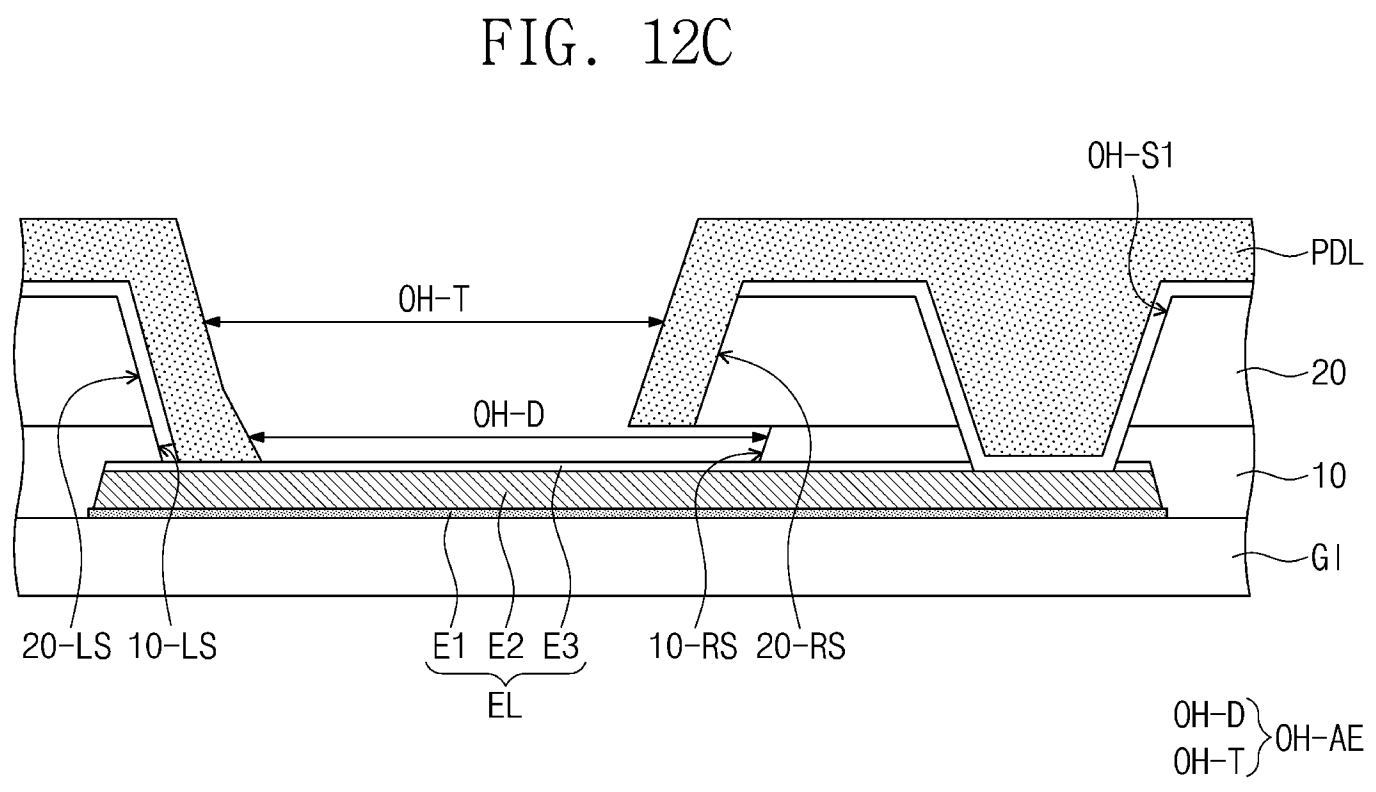

FIG. 12C illustrates a process of removing the photoresist PR and forming the pixel defining layer PDL after patterning the first electrode AE and the second insulating layer 20 as illustrated in FIG. 12B. FIG. 12C illustrates that the pixel defining layer PDL is patterned and the first insulating layer 10 is partially removed by etching solution.

As a portion of the first insulating layer 10 disposed under the pixel defining layer PDL may be partially removed by etching solution, the first side surface 10-RS of the first insulating layer 10 may be positioned more inward than the first side surface 20-RS of the second insulating layer 20. Therefore, the first side surface 10-RS of the first insulating layer 10 may not coincide (or be aligned) with the first side surface 20-RS of the second insulating layer 20 and may overlap the second insulating layer 20.

After the patterning of the pixel defining layer PDL and the additional etching of the first insulating layer 10 are performed, the electrode opening OH-EL may be formed. The electrode opening OH-EL may include: a lower opening formed as a space between the first side surface 10-RS of the exposed first insulating layer 10 and the second side surface 10-LS of the first insulating layer 10; and an upper opening OH-T formed as a space between the pixel defining layers exposed above the lower opening OH-D.

Figure 12D:
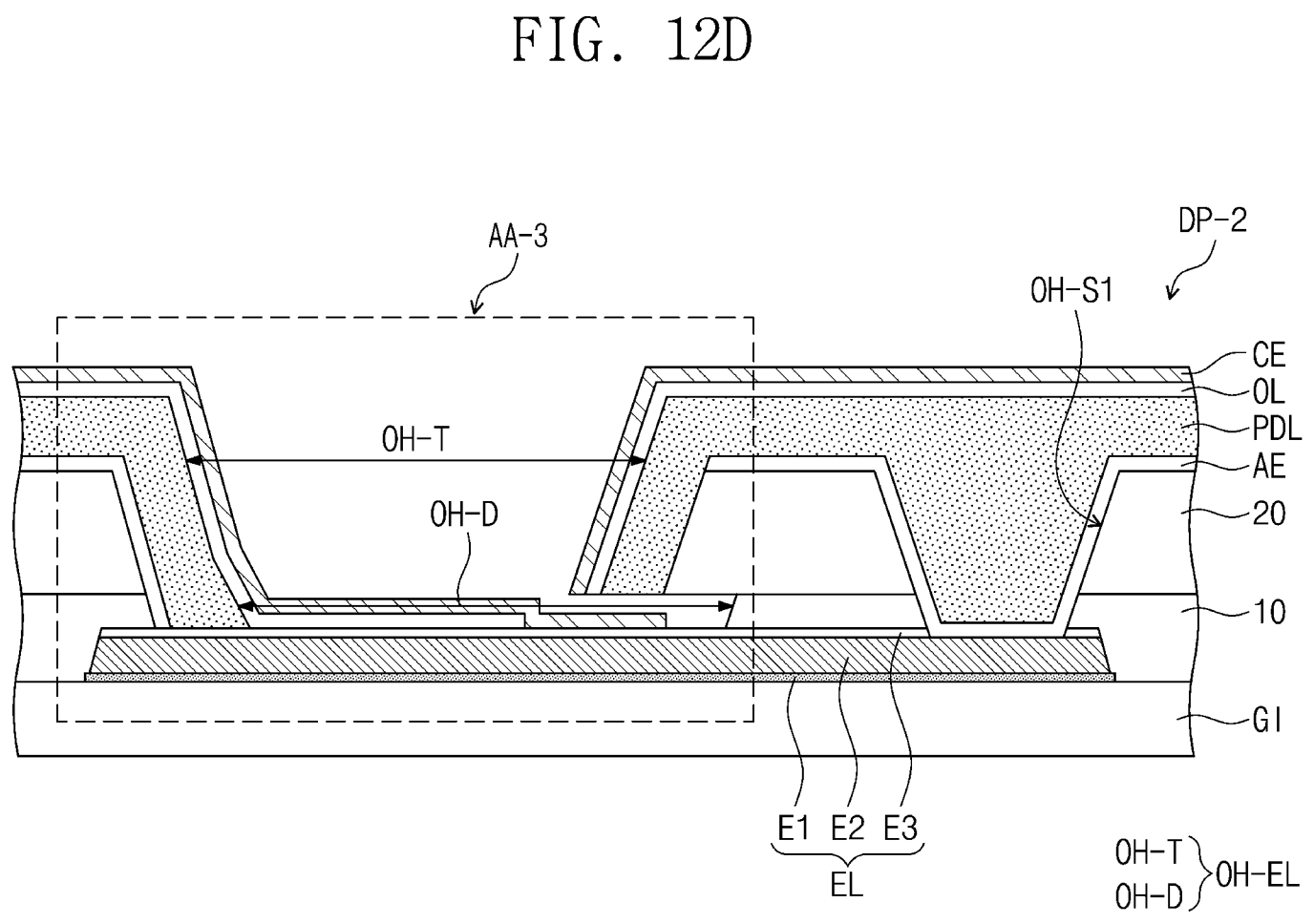

FIG. 12D illustrates a step of sequentially forming the functional layer OL and the second electrode CE on the pixel defining layer PDL and the auxiliary conductive layer EL. Referring to FIGS. 11 and 12D, unlike the deposited form of the functional layer OL, the second electrode CE may extend from the lower opening OH-D to the lower side of the protruding edge portion PD-ED. The second electrode CE may cover the functional layer OL, and the first end portion CE-LS of the second electrode CE may be disposed (e.g., directly disposed) on the upper surface of the auxiliary conductive layer EL. For example, the second end portion CE-RS of the disconnected second electrode CE may not be in contact with the auxiliary conductive layer EL or the first electrode AE and may be disposed on the functional layer OL.

The display panel DP-2 according to an embodiment, which is manufactured in the steps of FIGS. 12A to 12D, may have improved voltage stability, uniform luminance characteristics even in the case of a large area, and excellent reliability as the first end portion CE-LS of the disconnected second electrode CE is electrically connected to the upper surface of the auxiliary conductive layer EL.

Like the embodiment described with reference to FIGS. 8A to 8D, a method of manufacturing the display device according to an embodiment, which proceeds with the steps of FIGS. 12A to 12D, makes it possible for the second electrode CE and the auxiliary conductive layer EL to stably be in contact with each other by a process of patterning the first insulating layer 10, the second insulating layer 20, the first electrode AE, the pixel defining layer PDL and the like without a process of forming a separate contact hole for the contacting of the second electrode CE with the auxiliary conductive layer EL, and therefore the process may be simplified. Accordingly, the method of manufacturing the display device according to an embodiment may have excellent processability.

Figure 13:
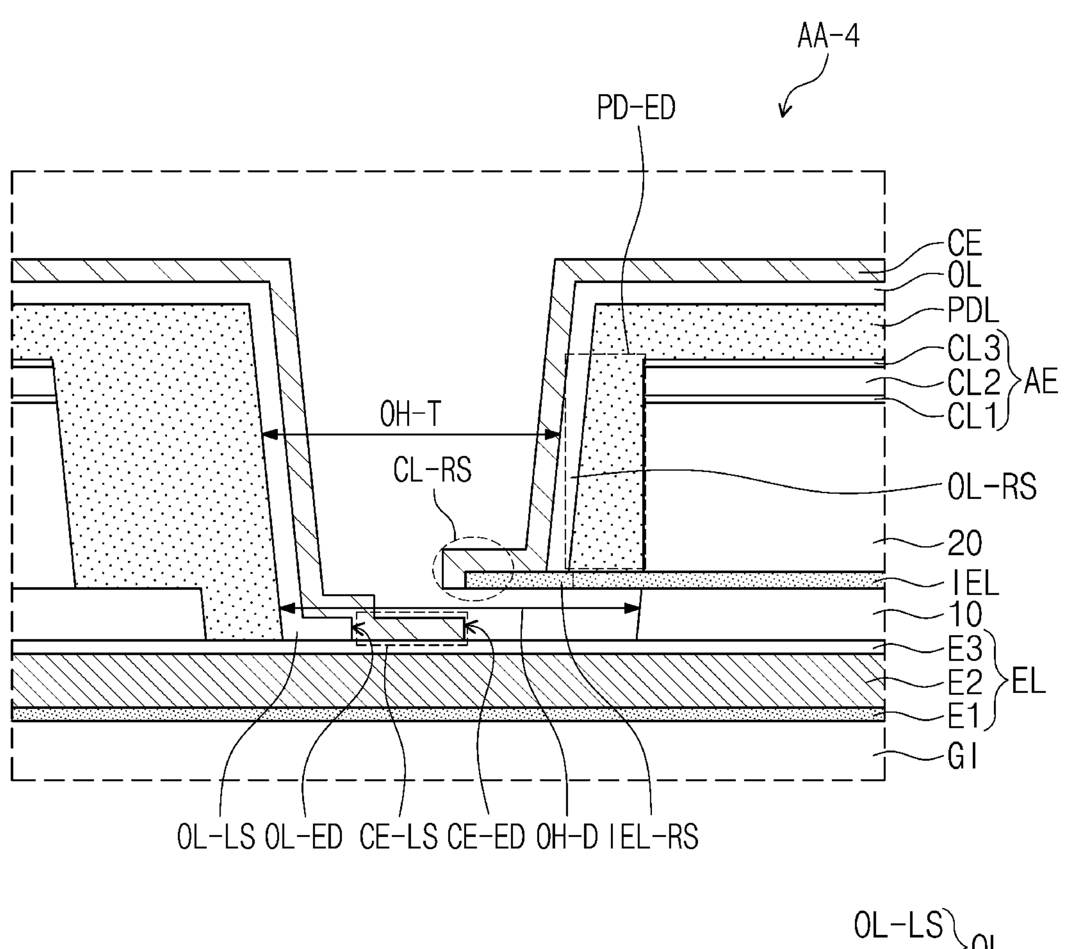
FIG. 13 is a schematic enlarged cross-sectional view of a portion of a display panel according to an embodiment.

FIG. 13 is a schematic cross-sectional view illustrating a portion of the display device according to an embodiment. FIGS. 14A to 14D illustrate a part of a manufacturing step of the display device according to an embodiment. FIG. 13 illustrates a portion of the display device manufactured by the steps of FIGS. 14A to 14D, and FIG. 13 may illustrate a portion corresponding to the region AA-4 in a display panel DP-3 of FIG. 14D.

In the display device according to an embodiment, the protruding edge portion PD-ED of the pixel defining layer PDL defining the electrode opening OH-EL may not overlap the first insulating layer 10 and may protrude toward inside of the electrode opening OH-EL. In an embodiment, the first insulating layer 10 may not be disposed under the protruding edge portion PD-ED of the pixel defining layer PDL, and thus the electrode opening OH-EL may have a step difference because a side surface defining a portion of an opening region is not continuous (or aligned) with a side surface defining another opening region, thereby having an undercut shape under the protruding edge portion PD-ED.

Referring to FIG. 13, the display device according to an embodiment may further include an intermediate conductive layer IEL disposed between the first insulating layer 10 and the second insulating layer 20. The intermediate conductive layer IEL may be disposed between the first insulating layer 10 and the second insulating layer 20, may not overlap the first insulating layer 10 and the second insulating layer 20, and may include a portion disposed on the lower side of the protruding edge portion PD-ED. An end IEL-RS of the intermediate conductive layer IEL may protrude toward inside of the electrode opening OH-EL. In an embodiment, the intermediate conductive layer IEL may include indium tin oxide (ITO). However, embodiments are not limited thereto.

In an embodiment, on a cross section perpendicular to the base substrate BS, the first side surface 10-RS of the first insulating layer 10 may be exposed through the electrode opening OH-EL, and the second side surface 10-LS of the first insulating layer 10, the first side surface 20-RS of the second insulating layer 20, and the second side surface 20-LS of the second insulating layer 20 may be covered by the pixel defining layer PDL.

The electrode opening OH-EL may include a lower opening OH-D and an upper opening OH-T formed above the lower opening OH-D. The lower opening OH-D may be formed as a space between the first side surface 10-RS of the first insulating layer 10 exposed under the protruding edge portion PD-ED of the pixel defining layer PDL and the pixel defining layer PDL covering the second side surface 10-LS of the first insulating layer 10. The upper opening OH-T may be formed as a space between the pixel defining layers PDL disposed above the lower opening OH-D. The functional layer OL may cover the pixel defining layer PDL exposed through the electrode opening OH-EL, and the second electrode CE may cover the functional layer OL.

Referring to FIG. 13, in the electrode opening OH-EL, each of the functional layer OL and the second electrode CE may not be continuous and may be disconnected. At least a portion of the auxiliary conductive layer EL may be exposed through the electrode opening OH-EL. In an embodiment, the first end portion CE-LS of the disconnected second electrode CE disposed in the electrode opening OH-EL may be disposed on the upper surface of the auxiliary conductive layer EL, and the disconnected second electrode CE may be disposed on the upper surface of the auxiliary conductive layer EL, and the second end portion CE-RS of the disconnected second electrode CE may be disposed on the intermediate conductive layer IEL.

In an embodiment, the first end portion OL-LS of the disconnected functional layer OL may be disposed (e.g., directly disposed) on the upper surface of the auxiliary conductive layer EL in the lower opening OH-D, and the first end portion CE-LS of the disconnected second electrode CE may cover the first end portion OL-LS of the functional layer OL in the lower opening OH-D. For example, the end edge portion CE-ED of the disconnected second electrode CE may protrude more toward inside of the lower opening OH-D than the end edge portion OL-ED of the disconnected functional layer OL. In an embodiment, the end edge portion CE-ED of the second electrode CE may be disposed (e.g., directly disposed) on the upper surface of the auxiliary conductive layer EL.

Referring to FIG. 14D, in the display panel DP-3 according to an embodiment, a first auxiliary opening OH-S1 spaced apart from the electrode opening OH-EL and passing through the first insulating layer 10 may be formed in the non-light-emitting area NPXA, and the second insulating layer 20 and a second auxiliary opening OH-S2 passing through the second insulating layer 20 between the electrode opening OH-EL and the first auxiliary opening OH-S1 may be formed in the non-light-emitting area NPXA.

The first auxiliary opening OH-S1 and the second auxiliary opening OH-S2 may overlap the auxiliary conductive layer EL and be formed in the first and second insulating layers 10 and 20. The upper surface of the auxiliary conductive layer EL may be exposed through the first auxiliary opening OH-S1, and the upper surface of the intermediate conductive layer IEL may be exposed through the second auxiliary opening OH-S2. In the first auxiliary opening OH-S1, the first electrode AE may be in contact with the upper surface of the auxiliary conductive layer EL, and in the second auxiliary opening OH-S2, the first electrode AE may be in contact with the upper surface of the intermediate conductive layer IEL.

In an embodiment, the second electrode CE may be in contact with the auxiliary conductive layer EL at least two points. In an embodiment, the first end portion CE-LS of the disconnected second electrode CE may be disposed (e.g., directly disposed) on the upper surface of the auxiliary conductive layer EL to be electrically connected to the auxiliary conductive layer EL, the second end portion CE-RS of the disconnected second electrode CE may be connected to the first electrode AE through the contacted intermediate conductive layer IEL, and the first electrode AE may again be electrically connected to the auxiliary conductive layer EL exposed through the first auxiliary opening OH-S1.

Figures 14A, 14B:
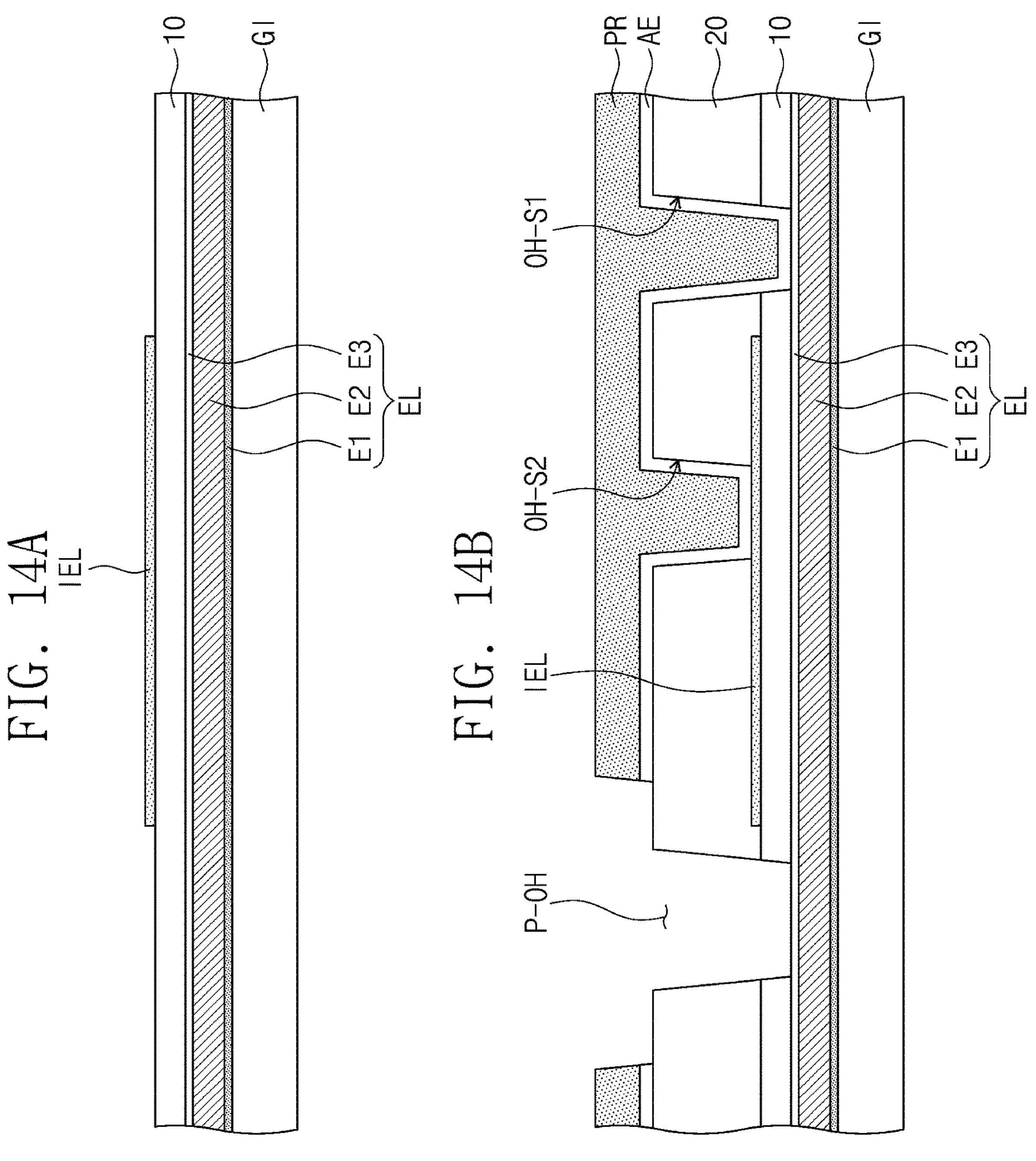
Figure 14C:
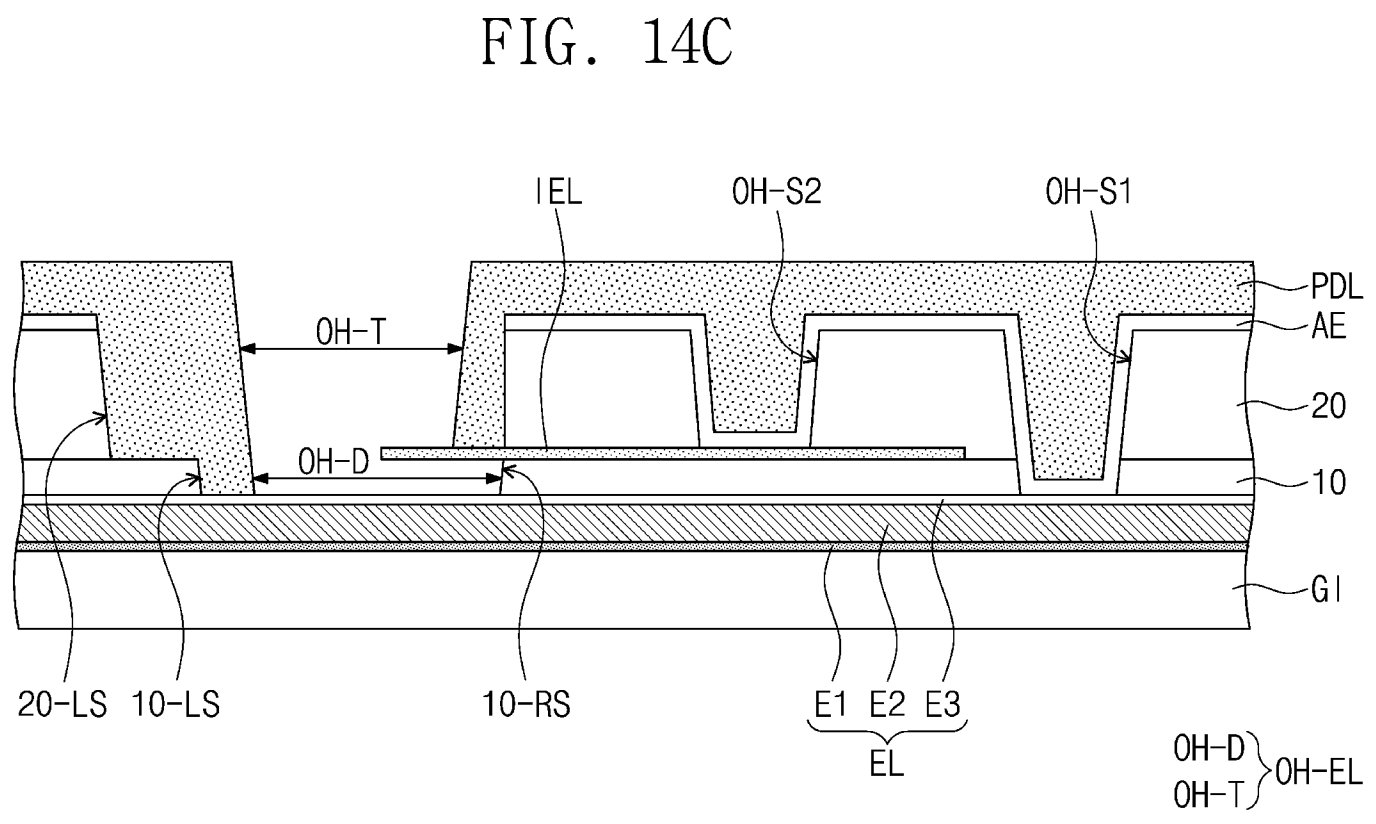
Figure 14D:
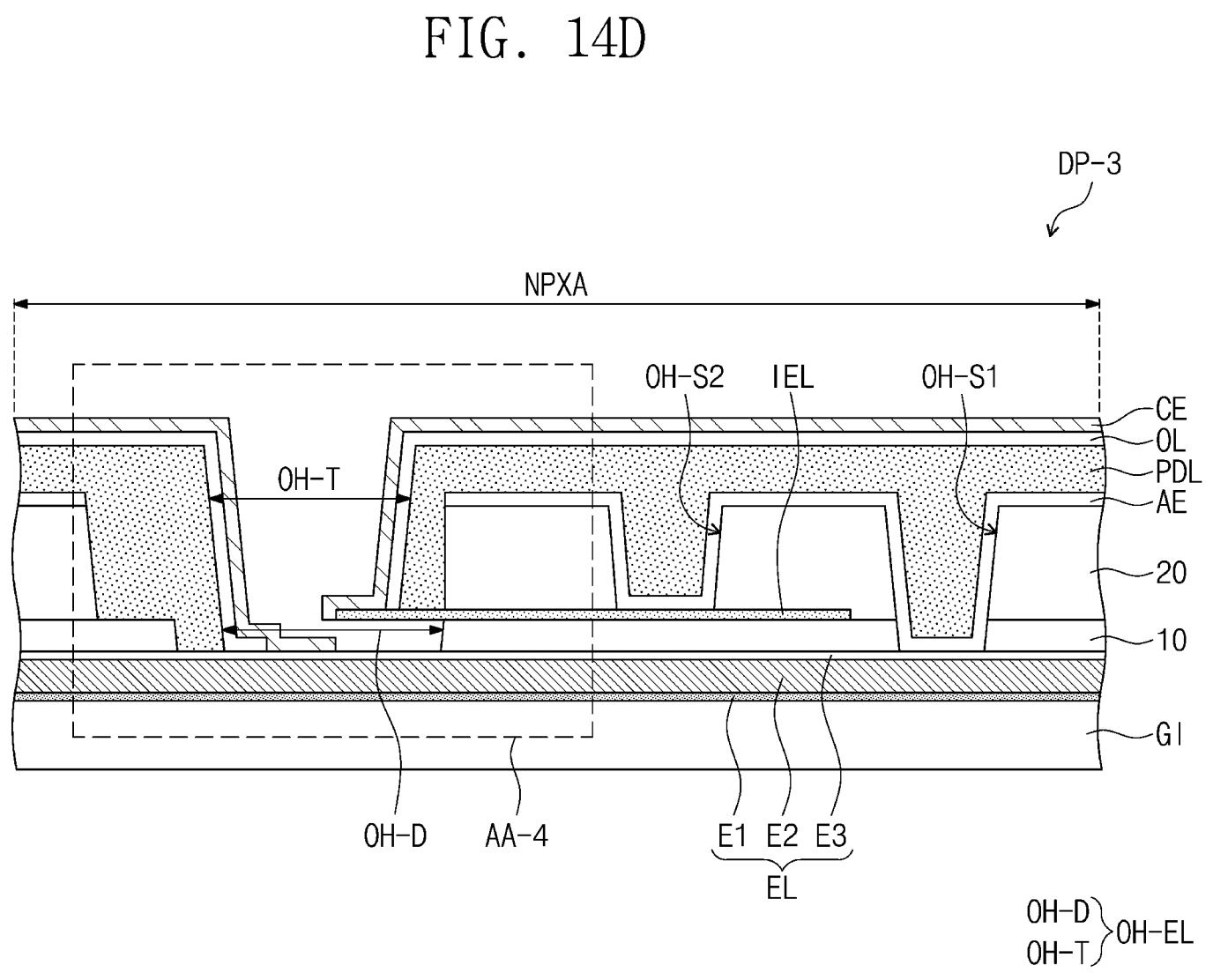

FIG. 14A illustrates a step of forming the first insulating layer 10 and the intermediate conductive layer IEL among the manufacturing steps of the display device according to an embodiment. In an embodiment, the auxiliary conductive layer EL may be formed on the interlayer insulating layer GI. The auxiliary conductive layer EL may be formed as a common layer, which is disposed (e.g., entirely disposed) in the non-light-emitting area NPXA. For example, the auxiliary conductive layer EL and the gate electrode G1 may be formed by being patterned in the same process (see FIG. 1). The first insulating layer 10 may be formed on the auxiliary conductive layer EL, and the intermediate conductive layer IEL may be formed by being patterned on the first insulating layer 10.

FIG. 14B illustrates a step of forming the openings P-OH, OH-S1, and OH-S2 and patterning the first electrode AE. In an embodiment, the second insulating layer 20 may be formed on the first insulating layer 10. The second insulating layer 20 may cover the patterned intermediate conductive layer IEL, and the second insulating layer 20 may be disposed on the first insulating layer 10. The preliminary opening P-OH may be formed in the first insulating layer 10 and the second insulating layer 20, and the second auxiliary opening OH-S2 and the first auxiliary opening OH-S1 may be spaced apart from the preliminary opening P-OH. The first auxiliary opening OH-S1 may be formed in the first insulating layer 10 and the second insulating layer 20, and the second auxiliary opening OH-S2 may be formed in the second insulating layer 20.

The first electrode AE may be deposited on the second insulating layer 20 in which the openings P-OH, OH-S1, and OH-S2 are formed, the photoresist PR may be coated on the first electrode AE, and the first electrode AE may be patterned so that a portion of the upper surface of the second insulating layer 20 may be exposed by a development and exposure process.

FIG. 14C illustrates a process of removing the photoresist PR and forming the pixel defining layer PDL after patterning the first electrode AE as illustrated in FIG. 14B. FIG. 14C illustrates that the first insulating layer 10 is partially removed by etching solution after the pixel defining layer PDL is patterned. A portion of the first insulating layer 10 disposed under the pixel defining layer PDL may be partially removed by etching solution, so that the upper surface of the auxiliary conductive layer EL may be additionally exposed.

After the pixel defining layer PDL is patterned and the first insulating layer 10 is additionally etched, the electrode opening OH-EL may be formed. The electrode opening OH-EL may include a lower opening OH-D formed as a space between the first side surface 10-RS of the exposed first insulating layer 10 and the pixel defining layer PDL covering the second side surface 10-LS of the first insulating layer 10, and an upper opening OH-T formed as a space between the pixel defining layers PDL exposed above the lower opening OH-D. Referring to FIG. 14C, after the patterning of the pixel defining layer PDL and the additional etching of the first insulating layer 10 are performed, the intermediate conductive layer IEL may protrude toward inside of the electrode opening OH-EL.

FIG. 14D illustrates a step of sequentially forming the functional layer OL and the second electrode CE on the pixel defining layer PDL and the auxiliary conductive layer EL. Referring to FIGS. 13 and 14D, unlike the deposited form of the functional layer OL, the second electrode CE may extend from the lower opening OH-D to the lower side of the protruding edge portion PD-ED. The second electrode CE may cover the functional layer OL, and the first end portion CE-LS of the second electrode CE may be disposed (e.g., directly disposed) on the upper surface of the auxiliary conductive layer EL. For example, the second end portion CE-RS of the disconnected second electrode CE may be in contact with the intermediate conductive layer IEL.

The display panel DP-3 according to an embodiment, which is manufactured in the steps of FIGS. 14A to 14D, may have improved voltage stability, uniform luminance characteristics even in the case of a large area, and excellent reliability as the first end portion CE-LS of the disconnected second electrode CE is electrically connected to the upper surface of the auxiliary conductive layer EL and the second end portion CE-RS of the second electrode CE is electrically connected to the intermediate conductive layer IEL.

Like the embodiment described with reference to FIGS. 8A through 8D, a method of manufacturing the display device according to an embodiment, which proceeds with the steps of FIGS. 14A to 14D, makes it possible for the second electrode CE and the auxiliary conductive layer EL to stably be in contact with each other by a process of patterning the first insulating layer 10, the second insulating layer 20, the first electrode AE, the pixel defining layer PDL and the like without a process of forming a separate contact hole for the contacting of the second electrode CE with the auxiliary conductive layer EL, and therefore the process may be simplified. Accordingly, the method of manufacturing the display device according to an embodiment may have excellent processability.

In the display device according to an embodiment: an electrode opening OH-EL overlapping the non-light-emitting area NPXA may be formed in the circuit layer DP-CL and the pixel defining layer PDL; the protruding edge portion PD-ED of the pixel defining layer PDL in the electrode opening OH-EL may not overlap the first insulating layer 10 and may protrude toward inside of the electrode opening OH-EL; the functional layer OL and the second electrode CE may be disconnected at the end portion of the protruding edge portion PD-ED; and the second electrode CE may be electrically connected to the auxiliary conductive layer EL in the electrode opening OH-EL under the protruding edge portion PD-ED. Therefore, the display device may have excellent reliability.

For example, the display device according to an embodiment may be manufactured by a display device manufacturing method which may simplify the process and have excellent processability by forming an opening that electrically connects the auxiliary conductive layer EL and the second electrode CE to each other in a manufacturing process of the circuit layer DP-CL and the display element layer DP-OL without a separate additional process such as laser drilling.

The display device according to an embodiment may improve the deterioration of display quality due to voltage drop and have excellent reliability by having at least a portion of the exposed auxiliary conductive layer EL and the second electrode CE of the light-emitting element OLED electrically connected to each other in the opening region formed to have an undercut shape.

As the display device according to an embodiment is manufactured so as to electrically connect the auxiliary conductive layer EL and the second electrode CE of the light-emitting element OLED to each other by using a circuit layer DP-CL forming process, excluding a laser drilling method, the process of manufacturing the display device according to an embodiment may be simplified.

concluding the detailed description, those skilled in the art will appreciate that many variations and modifications may be made to the embodiments without substantially departing from the principles and spirit and scope of the disclosure. Therefore, the disclosed embodiments are used in a generic and descriptive sense only and not for purposes of limitation.

What is claimed is:

1. A display device including a display region and a peripheral region disposed on at least one side of the display region, the display region comprising a light-emitting area and a non-light-emitting area, the display device comprising:

a base substrate;

a circuit layer disposed on the base substrate, the circuit layer comprising:

a transistor comprising a gate electrode, an auxiliary conductive layer, the auxiliary conductive layer and the gate electrode directly disposed on a same surface of a same layer, a first insulating layer disposed on the transistor and the auxiliary conductive layer, and a second insulating layer disposed on the first insulating layer; and a display element layer comprising:

a pixel defining layer disposed on the circuit layer, and a light-emitting element comprising a first electrode, a functional layer, and a second electrode which are sequentially stacked, wherein an electrode opening overlapping in a plan view the non-light-emitting area is formed in the circuit layer and the pixel defining layer to expose at least a portion of the auxiliary conductive layer, the pixel defining layer includes a protruding edge portion that does not overlap in the plan view the first insulating layer and protrudes toward inside of the electrode opening, each of the functional layer and the second electrode is directly disconnected at an end portion of the protruding edge portion, and the second electrode is electrically connected to the auxiliary conductive layer through the electrode opening, wherein a first end portion of the second electrode disposed in the electrode opening is disposed on an upper surface of the auxiliary conductive layer, and a second end portion of the second electrode is in contact with an edge portion of the first electrode disposed on a lower surface of the protruding edge portion, wherein a first side surface of the first insulating layer and a first side surface of the second insulating layer are exposed through the electrode opening, a second side surface of the first insulating layer and a second side surface of the second insulating layer are covered by the first electrode and the pixel defining layer, which are sequentially stacked, and the electrode opening comprises:

a lower opening including a space under the protruding edge portion of the pixel defining layer and disposed between the first side surface of the second insulating layer and the second side surface of the second insulating layer exposed through the space; and an upper opening formed in the pixel defining layer and disposed above the lower opening.

2. The display device of claim 1, wherein the protruding edge portion of the pixel defining layer protrudes more toward inside of the electrode opening than a side edge portion of the first insulating layer, and the electrode opening includes a space under the protruding edge portion of the pixel defining layer.

3. The display device of claim 1, wherein the first end portion of the second electrode is disposed directly on the upper surface of the auxiliary conductive layer, and the second end portion of the second electrode is electrically connected to the auxiliary conductive layer through the edge portion of the first electrode disposed on the lower surface of the protruding edge portion.

4. The display device of claim 1, wherein a first end portion of the functional layer covers the pixel defining layer covering the second side surface of the second insulating layer in the lower opening, and a second end portion of the functional layer covers the pixel defining layer defining the upper opening.

5. The display device of claim 4, wherein an end edge portion of the second electrode protrudes more toward inside of the lower opening than an end edge portion of the functional layer, and the end edge portion of the second electrode is disposed directly on the upper surface of the auxiliary conductive layer.

6. The display device of claim 4, wherein the first electrode is disposed on the lower surface of the protruding edge portion, and a lower surface of the first electrode overlapping in the plan view the protruding edge portion does not overlap in the plan view the second insulating layer in the lower opening.

7. The display device of claim 1, wherein a thickness of the second insulating layer overlapping in the plan view the non-light-emitting area is smaller than a thickness of the second insulating layer overlapping in the plan view the light-emitting area.

8. A display device including a display region and a peripheral region disposed on at least one side of the display region, the display region comprising a light-emitting area and a non-light-emitting area, the display device comprising:

a base substrate;

a circuit layer disposed on the base substrate, the circuit layer comprising:

a transistor comprising a gate electrode, an auxiliary conductive layer, the auxiliary conductive layer and the gate electrode directly disposed on a same surface of a same layer, a first insulating layer disposed on the transistor and the auxiliary conductive layer, and a second insulating layer disposed on the first insulating layer; and a display element layer comprising:

a pixel defining layer disposed on the circuit layer, and a light-emitting element comprising a first electrode, a functional layer, and a second electrode which are sequentially stacked, wherein an electrode opening overlapping in a plan view the non-light-emitting area is formed in the circuit layer and the pixel defining layer to expose at least a portion of the auxiliary conductive layer, the pixel defining layer includes a protruding edge portion that does not overlap in the plan view the first insulating layer and protrudes toward inside of the electrode opening, each of the functional layer and the second electrode is directly disconnected at an end portion of the protruding edge portion, and the second electrode is electrically connected to the auxiliary conductive layer through the electrode opening, wherein each of the gate electrode and the auxiliary conductive layer comprises:

a first sub-layer comprising titanium (Ti), a second sub-layer comprising copper (Cu), and a third sub-layer comprising indium tin oxide (ITO), wherein a first end portion of the second electrode in the electrode opening is in contact with the second sub-layer of the auxiliary conductive layer, and a second end portion of the second electrode is in contact with the third sub-layer of the auxiliary conductive layer, wherein a second side surface of the first insulating layer is not covered by the pixel defining layer, a first side surface of the first insulating layer, a first side surface of the second insulating layer, and a second side surface of the second insulating layer are covered by the pixel defining layer, and the electrode opening comprises:

a lower opening including a space under the protruding edge portion of the pixel defining layer and disposed between the second sub-layer of the auxiliary conductive layer exposed through the space and the second side surface of the first insulating layer; and an upper opening formed in the pixel defining layer and disposed above the lower opening.

9. The display device of claim 8, wherein a first end portion of the functional layer covers the second side surface of the first insulating layer in the lower opening, and a second end portion of the functional layer is disposed on the pixel defining layer defining the upper opening.

10. The display device of claim 8, wherein an end edge portion of the second electrode protrudes more toward inside of the lower opening than an end edge portion of the functional layer, and the end edge portion of the second electrode is disposed directly on a side surface of the auxiliary conductive layer.

11. The display device of claim 8, wherein:

the first end portion of the second electrode is disposed directly on an inclined side surface of the second sub-layer of the auxiliary conductive layer, and the second end portion of the second electrode is in contact with a side surface of the first sub-layer of the auxiliary conductive layer overlapping in the plan view the protruding edge portion.

12. A display device including a display region and a peripheral region disposed on at least one side of the display region, the display region comprising a light-emitting area and a non-light-emitting area, the display device comprising:

a base substrate;

a circuit layer disposed on the base substrate, the circuit layer comprising:

a transistor comprising a gate electrode, an auxiliary conductive layer, the auxiliary conductive layer and the gate electrode directly disposed on a same surface of a same layer, a first insulating layer disposed on the transistor and the auxiliary conductive layer, and a second insulating layer disposed on the first insulating layer; and a display element layer comprising:

a pixel defining layer disposed on the circuit layer, and a light-emitting element comprising a first electrode, a functional layer, and a second electrode which are sequentially stacked, wherein an electrode opening overlapping in a plan view the non-light-emitting area is formed in the circuit layer and the pixel defining layer to expose at least a portion of the auxiliary conductive layer, the pixel defining layer includes a protruding edge portion that does not overlap in the plan view the first insulating layer and protrudes toward inside of the electrode opening, each of the functional layer and the second electrode is directly disconnected at an end portion of the protruding edge portion, and the second electrode is electrically connected to the auxiliary conductive layer through the electrode opening, wherein a first end portion of the second electrode disposed in the electrode opening is disposed on an upper surface of the auxiliary conductive layer, wherein a first side surface of the first insulating layer is exposed through the electrode opening, a second side surface of the first insulating layer, a first side surface of the second insulating layer, and a second side surface of the second insulating layer are covered by the pixel defining layer, and the first side surface of the second insulating layer faces the electrode opening and the electrode opening comprises:

a lower opening including a space under the protruding edge portion of the pixel defining layer and disposed between the first side surface of the first insulating layer and the second side surface of the first insulating layer exposed through the space; and an upper opening formed in the pixel defining layer and disposed above the lower opening.

13. The display device of claim 12, wherein the functional layer covers the pixel defining layer exposed through the electrode opening.

14. The display device of claim 13, wherein a first end portion of the functional layer is disposed directly on the upper surface of the auxiliary conductive layer in the lower opening, a first end portion of the second electrode covers the first end portion of the functional layer in the lower opening, and an end edge portion of the second electrode protrudes more toward inside of the lower opening than an end edge portion of the functional layer.

15. The display device of claim 14, wherein the first end portion of the second electrode is disposed directly on the upper surface of the auxiliary conductive layer, and a second end portion of the second electrode is insulated from the first electrode and the auxiliary conductive layer by the pixel defining layer.

16. A display device including a display region and a peripheral region disposed on at least one side of the display region, the display region comprising a light-emitting area and a non-light-emitting area, the display device comprising:

a base substrate;

a circuit layer disposed on the base substrate, the circuit layer comprising:

a transistor comprising a gate electrode, an auxiliary conductive layer, the auxiliary conductive layer and the gate electrode directly disposed on a same surface of a same layer, a first insulating layer disposed on the transistor and the auxiliary conductive layer, and a second insulating layer disposed on the first insulating layer; and a display element layer comprising:

a pixel defining layer disposed on the circuit layer, and a light-emitting element comprising a first electrode, a functional layer, and a second electrode which are sequentially stacked, wherein an electrode opening overlapping in a plan view the non-light-emitting area is formed in the circuit layer and the pixel defining layer to expose at least a portion of the auxiliary conductive layer, the pixel defining layer includes a protruding edge portion that does not overlap in the plan view the first insulating layer and protrudes toward inside of the electrode opening, each of the functional layer and the second electrode is directly disconnected at an end portion of the protruding edge portion, and the second electrode is electrically connected to the auxiliary conductive layer through the electrode opening, further comprising:

an intermediate conductive layer overlapping in the plan view the non-light-emitting area and disposed between the first insulating layer and the second insulating layer, wherein an end portion of the intermediate conductive layer is disposed under the protruding edge portion and protrudes toward inside of the electrode opening, wherein a first end portion of the second electrode disposed in the electrode opening is disposed on an upper surface of the auxiliary conductive layer, and a second end portion of the second electrode is in contact with the intermediate conductive layer disposed on a lower surface of the protruding edge portion wherein a first side surface of the first insulating layer is exposed through the electrode opening, a second side surface of the first insulating layer, a first side surface of the second insulating layer, and a second side surface of the second insulating layer are covered by the pixel defining layer, the first side surface of the second insulating layer faces the electrode opening and the electrode opening comprises:

a lower opening including a space under the protruding edge portion and disposed between the first side surface of the first insulating layer and the second side surface of the first insulating layer exposed through the space; and an upper opening formed in the pixel defining layer and disposed above the lower opening.

17. The display device of claim 16, wherein the functional layer covers the pixel defining layer exposed through the electrode opening.

18. The display device of claim 16, wherein a first end portion of the functional layer is disposed directly on the upper surface of the auxiliary conductive layer in the lower opening, a first end portion of the second electrode covers the first end portion of the functional layer in the lower opening, and an end edge portion of the second electrode protrudes more toward inside of the lower opening than an end edge portion of the functional layer.

19. The display device of claim 18, wherein the end edge portion of the second electrode is disposed directly on the upper surface of the auxiliary conductive layer.

20. The display device of claim 16, wherein a first auxiliary opening spaced apart from the electrode opening and passing through the first insulating layer and the second insulating layer is formed in the non-light-emitting area, a second auxiliary opening passing through the second insulating layer between the electrode opening and the first auxiliary opening is formed in the non-light-emitting area, the upper surface of the auxiliary conductive layer is exposed through the first auxiliary opening, and an upper surface of the intermediate conductive layer is exposed through the second auxiliary opening.

21. The display device of claim 20, wherein the first electrode is in contact with the upper surface of the auxiliary conductive layer through the first auxiliary opening, and the first electrode is in contact with the upper surface of the intermediate conductive layer through the second auxiliary opening.

22. The display device of claim 16, wherein an end edge portion of the second electrode is disposed directly on the upper surface of the auxiliary conductive layer, and the second end portion of the second electrode is electrically connected to the auxiliary conductive layer through the intermediate conductive layer and the first electrode in contact with the intermediate conductive layer.

23. The display device of claim 16, wherein the intermediate conductive layer comprises indium tin oxide (ITO).

24. The display device of claim 1, wherein in the non-light-emitting area, an auxiliary opening is formed in the circuit layer and is spaced apart from the electrode opening, and the first electrode is electrically connected to the auxiliary conductive layer in the auxiliary opening.

25. The display device of claim 24, wherein an upper portion of the auxiliary opening is filled with the pixel defining layer.

* * * * *